United States Patent
Lei et al.

(10) Patent No.: US 12,501,705 B2
(45) Date of Patent: Dec. 16, 2025

(54) DRIVE BACKPLANE, PREPARATION METHOD THEREFOR, AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Jie Lei, Beijing (CN); Zouming Xu, Beijing (CN); Jian Tian, Beijing (CN); Chunjian Liu, Beijing (CN); Xintao Wu, Beijing (CN); Jie Wang, Beijing (CN); Jianying Zhang, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 861 days.

(21) Appl. No.: 17/778,415

(22) PCT Filed: Jun. 21, 2021

(86) PCT No.: PCT/CN2021/101227
§ 371 (c)(1),
(2) Date: Dec. 29, 2022

(87) PCT Pub. No.: WO2022/266795
PCT Pub. Date: Dec. 29, 2022

(65) Prior Publication Data
US 2024/0234434 A1    Jul. 11, 2024

(51) Int. Cl.
*H10D 86/60* (2025.01)
*H01L 25/075* (2006.01)
(Continued)

(52) U.S. Cl.
CPC .......... *H10D 86/60* (2025.01); *H01L 25/0753* (2013.01); *H01L 25/18* (2013.01); *H10D 86/0221* (2025.01); *H10D 86/441* (2025.01)

(58) Field of Classification Search
None
See application file for complete search history.

(56) References Cited

U.S. PATENT DOCUMENTS

2007/0012954 A1* 1/2007 Murayama ............. A61B 1/051
257/222
2011/0157133 A1  6/2011 Ogura
(Continued)

FOREIGN PATENT DOCUMENTS

CN       102110411 A    6/2011
CN       104134759 A    11/2014
(Continued)

*Primary Examiner* — Bo B Jang
(74) *Attorney, Agent, or Firm* — Ling Wu Stephen Yang Ling and Yang Intellectual Property

(57) ABSTRACT

Disclosed are a drive backplane, a preparation method therefor, and a display apparatus. The drive backplane includes a substrate, wherein the substrate includes a light emitting region and a bonding region, the light emitting region includes light emitting units arranged in an array, each light emitting unit includes a first signal line and a pad electrically connected with the first signal line; a first conductive layer, which is disposed on one side of the substrate and includes a first signal line and at least one signal detection line; and a second conductive layer, which is disposed on one side of the first conductive layer facing away from the substrate and includes: a pad; wherein the signal detection line is electrically connected with the pad of the light emitting unit.

12 Claims, 12 Drawing Sheets

(51) Int. Cl.
    *H01L 25/18*   (2023.01)
    *H10D 86/01*   (2025.01)
    *H10D 86/40*   (2025.01)

(56) References Cited

U.S. PATENT DOCUMENTS

| | | |
|---|---|---|
| 2014/0329345 A1 | 11/2014 | Lee |
| 2014/0374703 A1 | 12/2014 | Jung |
| 2016/0358525 A1 | 12/2016 | Huang et al. |
| 2018/0254226 A1 | 9/2018 | Iguchi |

FOREIGN PATENT DOCUMENTS

| | | |
|---|---|---|
| CN | 107924653 A | 4/2018 |
| TW | 201643630 A | 12/2016 |

\* cited by examiner

DRIVE BACKPLANE, PREPARATION METHOD THEREFOR, AND DISPLAY APPARATUS

CROSS-REFERENCE TO RELATED APPLICATION

The present application is a U.S. National Phase Entry of International Application No. PCT/CN2021/101227, having an international filing date of Jun. 21, 2021, the entire content of which is hereby incorporated by reference.

TECHNICAL FIELD

Embodiments of the present disclosure relate to, but are not limited to, the field of display technologies, and more particularly, to a drive backplane, a preparation method therefor, and a display apparatus.

BACKGROUND

A semiconductor Light Emitting Diode (LED) technology has developed for nearly 30 years, from an initial solid-state lighting power supply to a backlight in the display field, and then to an LED display screen, providing a solid foundation for its wider applications. Herein, with development of chip fabrication and an encapsulation technology, a backlight using a sub-millimeter-scale or even micron-scale Micro LED has been widely used.

A main structure of a backlight based on an LED technology includes a drive backplane and a control circuit. By means of fine adjustment of an LED on the drive backplane through the control circuit, High Dynamic Range (HDR) display may be achieved.

SUMMARY

The following is a summary about subject matters described herein in detail. This summary is not intended to limit the scope of protection of claims.

In a first aspect, the present disclosure provides a drive backplane, including: a substrate; wherein the substrate includes a light emitting region and a bonding region, the light emitting region includes light emitting units arranged in an array, and each light emitting unit includes a first signal line and a pad electrically connected with the first signal line; a first conductive layer, which is disposed on one side of the substrate and includes a first signal line and at least one signal detection line; and a second conductive layer, which is disposed on one side of the first conductive layer away from the substrate and includes a pad; wherein the signal detection line is electrically connected with the pad of the light emitting unit.

In some possible implementations, the drive backplane further includes: a bonding terminal which is disposed on the substrate and located in the bonding region, and a flexible circuit board electrically connected with the bonding terminal; the pad of the light emitting unit is electrically connected with the bonding terminal through the signal detection line.

In some possible implementations, the light emitting region is divided into at least one light emitting sub-region; at least one signal detection line is electrically connected with a pad of at least one light emitting unit in each light emitting sub-region.

In some possible implementations, one of the at least one signal detection line is electrically connected with a pad of one light emitting unit in each light emitting sub-region.

In some possible implementations, one of the at least one signal detection line is electrically connected with a pad of a light emitting unit located in a last row and a k-th column in each light emitting sub-region; $1 \le i \le m$, m is a total number of columns of light emitting units in the light emitting sub-region.

In some possible implementations, the drive backplane includes at least two drive sub-backplanes; each drive backplane includes at least one light emitting sub-region.

In some possible implementations, for each light emitting unit, an orthographic projection of the pad on the substrate is partially overlapped with an orthographic projection of the first signal line on the substrate; an orthographic projection of the signal detection line on the substrate is partially overlapped with the orthographic projection of the pad on the substrate.

In some possible implementations, the drive backplane further includes a first insulation layer disposed between the substrate and the first conductive layer, a second insulation layer disposed between the first conductive layer and the second conductive layer, and a third insulation layer disposed on one side of the second conductive layer away from the substrate; the second insulation layer is provided with a first via and a second via; the first via exposes the first signal line, and the second via exposes the signal detection line.

In some possible implementations, the pad of the light emitting unit is electrically connected with the first signal line through the first via and is electrically connected with the signal detection line through the second via.

In some possible implementations, the first signal line extends along a first direction, and the light emitting unit further includes a second signal line, a third signal line, a fourth signal line, and a fifth signal line extending along the first direction; the first signal line and the second signal line are arranged along a second direction, the third signal line and the fourth signal line are arranged along the first direction, the first direction and the second direction intersect; the first conductive layer further includes a second signal line, a third signal line, a fourth signal line, and a fifth signal line; the second signal line is located on one side of the first signal line, the third signal line and the fourth signal line are located on one side of the first signal line away from the second signal line, and the fifth signal line is located on one side of the third signal line away from the first signal line; and the signal detection line is disposed between a third signal line and a first signal line in a light emitting unit where a pad with which the signal detection line is connected is located.

In some possible implementations, first signal lines of light emitting units located in a same column are a same signal line.

In some possible implementations, the light emitting unit further includes a first die-bonding region, a second die-bonding region, a third die-bonding region, a fourth die-bonding region, a first connection line, a second connection line, a third connection line, a fourth connection line, and a fifth connection line, the pad includes a first pad connection line, a second pad connection line, a third pad connection line, a fourth pad connection line, a first input terminal, a second input terminal, an output terminal, and a common voltage terminal; each die-bonding region includes a first terminal and a second terminal oppositely disposed at intervals, and the first terminal and the second terminal are configured to connect two electrodes of a same light emitting element; the second conductive layer further includes a first connection line, a second connection line, a third connection line, a fourth connection line, and a fifth connection line; a first end of the first connection line is electrically connected with a second signal line, a second end of the first connection line extends to the first die-bonding region and forms a first terminal in the first die-bonding region; a first end of the second connection line extends to the first die-bonding region and forms a second terminal in the first die-bonding region, a second end of the second connection line extends to the second die-bonding region and forms a first terminal in the second die-bonding region; a first end of the third connection line extends to the second die-bonding region and forms a second terminal in the second die-bonding region, a second end of the third connection line extends to the third die-bonding region and forms a first terminal in the third die-bonding region; a first end of the fourth connection line extends to the third die-bonding region, and forms a second terminal in the third die-bonding region, a second end of the fourth connection line extends to the fourth die-bonding region and forms a first terminal in the fourth die-bonding region, a first end of the fifth connection line extends to the fourth die-bonding region and forms a first terminal in the fourth die-bonding region, a second end of the fifth connection line is electrically connected with a third signal line; the first pad connection line and the second pad connection line are arranged along a second direction, the second pad connection line and the third pad connection line are arranged along a first direction, the third pad connection line and the fourth pad connection line are arranged along the second direction, and the fourth pad connection line and the first pad connection line are arranged along the first direction; the first pad connection line is located on a side of the second pad connection line close to a fifth signal line; the first pad connection line is electrically connected with the common voltage terminal and the first signal line, the second pad connection line is electrically connected with the first input terminal and a fourth signal line, the third pad connection line is electrically connected with the second input terminal and the fifth signal line, and the fourth pad connection line is electrically connected with the output terminal and the third signal line; the fifth connection line and the fourth pad connection line are disposed separately, or the fifth connection line and the fourth pad connection line are a same signal line.

In some possible implementations, the second insulation layer is further provided with a third via to a sixth via; the third via exposes the second signal line, a fourth via exposes the fourth signal line, a fifth via exposes the fifth signal line, and the sixth via exposes the third signal line; for each light emitting unit, a first connection line is electrically connected with a second signal line through the third via, a first pad connection line is electrically connected with a first signal line through the first via and is electrically connected with a signal detection line through the second via, a second pad connection line is electrically connected with a fourth signal line through the fourth via, a third pad connection line is electrically connected with a fifth signal line through the fifth via, and a fourth pad connection line and a fifth connection line are electrically connected with a third signal line through the sixth via.

In some possible implementations, a width of the first signal line is greater than a width of the second signal line; the width of the second signal line is greater than a width of the fifth signal line; the width of the fifth signal line is greater than a width of the third signal line; the width of the fifth signal line is greater than a width of the fourth signal line; a width of the signal detection line is less than the width of the fifth signal line; and the width of the signal detection line is about 0.5 mm to 1.5 mm.

In a second aspect, the present disclosure also provides a display apparatus including the above-mentioned drive backplane.

In a third aspect, the present disclosure also provides a preparation method of a drive backplane, configured to prepare the above-mentioned drive backplane, and the method includes: providing a substrate, wherein the substrate includes a light emitting region and a bonding region, the light emitting region includes light emitting units arranged in an array, each light emitting unit includes a first signal line and a pad electrically connected with the first signal line; forming a first conductive layer on the substrate; wherein the first conductive layer includes a first signal line and at least one signal detection line; and forming a second conductive layer on a side of the first conductive layer away from the substrate; wherein the second conductive layer includes a pad; and the signal detection line is electrically connected with the pad of the light emitting unit.

In some possible implementations, the forming the first conductive layer on the substrate includes: forming a first insulation layer on the substrate; forming the first conductive layer on the first insulation layer, wherein the first conductive layer further includes a second signal line, a third signal line, a fourth signal line, and a fifth signal line; the forming the second conductive layer on the side of the first conductive layer away from the substrate includes: forming a second insulation layer on the first conductive layer; and forming the second conductive layer on the second insulation layer, wherein the second conductive layer further includes a first connection line, a second connection line, a third connection line, a fourth connection line, and a fifth connection line; after forming the second conductive layer on the side of the first conductive layer away from the substrate, the method further includes: forming a third insulation layer on the second conductive layer.

After accompanying drawings and detailed descriptions are read and understood, other aspects may be understood.

BRIEF DESCRIPTION OF DRAWINGS

The accompanying drawings are used for providing understanding of technical solutions of the present disclosure, and form a part of the specification. They are used for explaining the technical solutions of the present disclosure together with the embodiments of the present disclosure, and do not form a limitation on the technical solutions of the present disclosure.

DETAILED DESCRIPTION

Figure 1:
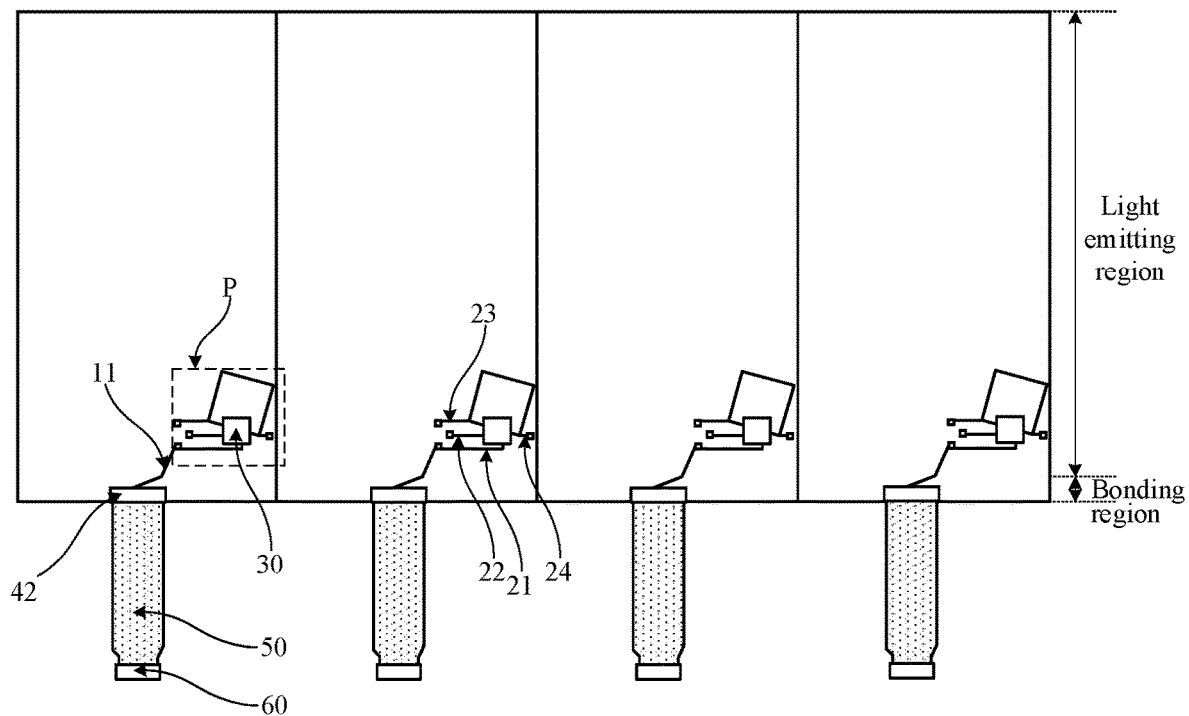
FIG. 1 is a first schematic diagram of a plane structure of a drive backplane provided in an embodiment of the present disclosure.

To make objectives, technical solutions, and advantages of the present disclosure clearer, the embodiments of the present disclosure will be described in detail with reference to the accompanying drawings. It is to be noted that implementations may be implemented in multiple different forms. Those of ordinary skill in the art may easily understand such a fact that manners and contents may be transformed into various forms without departing from the purpose and scope of the present disclosure. Therefore, the present disclosure should not be interpreted as being limited to the contents recorded in the following implementations only. The embodiments in the present disclosure and features in the embodiments may be arbitrarily combined with each other without conflict.

Sometimes for clarity, sizes of various constituent elements, thicknesses of layers or regions in the drawings may be exaggerated. Therefore, one mode of the present disclosure is not necessarily limited to the sizes, and shapes and sizes of various components in the drawings do not reflect actual scales. In addition, the drawings schematically illustrate ideal examples, and one mode of the present disclosure is not limited to the shapes, numerical values, or the like shown in the drawings.

Ordinal numerals such as "first", "second", and "third" in the specification are set to avoid confusion of constituent elements, but are not intended to limit in terms of quantity.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The position relationships between the constituent elements change appropriately according to a direction in which various constituent elements are described. Therefore, description is not limited to words and phrases used in the specification, and appropriate substitutions may be made according to situations.

In the specification, unless otherwise specified and defined explicitly, terms "install", "mutually connect", and "connect" should be understood in a broad sense. For example, a connection may be a fixed connection, a detachable connection, or an integrated connection; or it may be a mechanical connection or an electrical connection; or it may be a direct connection, an indirect connection through an intermediate component, or communication inside two elements. Those of ordinary skill in the art may understand specific meanings of these terms in the present disclosure according to specific situations.

In the specification, a transistor refers to a component which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region that a current mainly flows through.

In the specification, a first electrode may be a drain electrode, and a second electrode may be a source electrode. Or, a first electrode may be a source electrode, and a second electrode may be a drain electrode. In a case that transistors with opposite polarities are used or that a direction of a current is changed during circuit operation, functions of the "source electrode" and the "drain electrode" may sometimes be exchanged. Therefore, the "source electrode" and the "drain electrode" may be exchanged in the specification.

In the specification, an "electrical connection" includes a case that constituent elements are connected together through an element with some electrical function. The "element with some electrical function" is not particularly limited as long as it allows sending and receiving of electric signals between the connected constituent elements. Examples of the "element with some electrical function" include not only an electrode and a wiring, but also a switching element such as a transistor, a resistor, an inductor, a capacitor, other elements with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed.

Micro LEDs may include a miniature Light Emitting Diode (Micro Light Emitting Diode (Micro-LED)) and a sub-millimeter Light Emitting Diode (Mini Light Emitting Diode (Mini-LED)), which have advantages of small size and high brightness, such that may be widely used in backlight modules of display apparatuses. Contrast of a picture of a display product using a Micro LED backlight may reach a level of an Organic Light Emitting Diode (OLED for short) display product, which may make the product retain technical advantages of Liquid Crystal Display (LCD for short), thereby improving a display effect of the picture and providing users with a better visual experience. Furthermore, Micro LED display has gradually become a hot spot of a display panel, and is mainly used in Augmented Reality/Virtual Reality (AR/VR), Television (TV), outdoor display, and other fields.

At present, for a Micro LED backlight, an LED chip is usually miniaturized, arrayed, and thin-filmed by using a miniaturization process technology, and LED chips are transferred to a drive backplane in batches through a mass transfer technology. A typical size (e.g., length) of a Micro-LED may be less than 100 µm, e.g., 10 µm to 50 µm. A typical size (e.g., length) of a Mini-LED may be about 100 µm to 300 µm, e.g., 120 µm to 260 µm. The drive backplane usually includes a plurality of light emitting units, each of which may include a plurality of Micro LEDs configured in series and a Display Drive Integrated Circuit (DDIC).

There is a common voltage line set in the Micro LED backlight, and a voltage drop of the common voltage line is related to electrical performance of the whole Micro LED backlight. A relatively large voltage drop of the common voltage line will affect a current flowing into a light emitting unit, reduce uniformity of the light emitting unit, and lead to a poor display effect and short service life of the Micro LED backlight.

Figure 2:
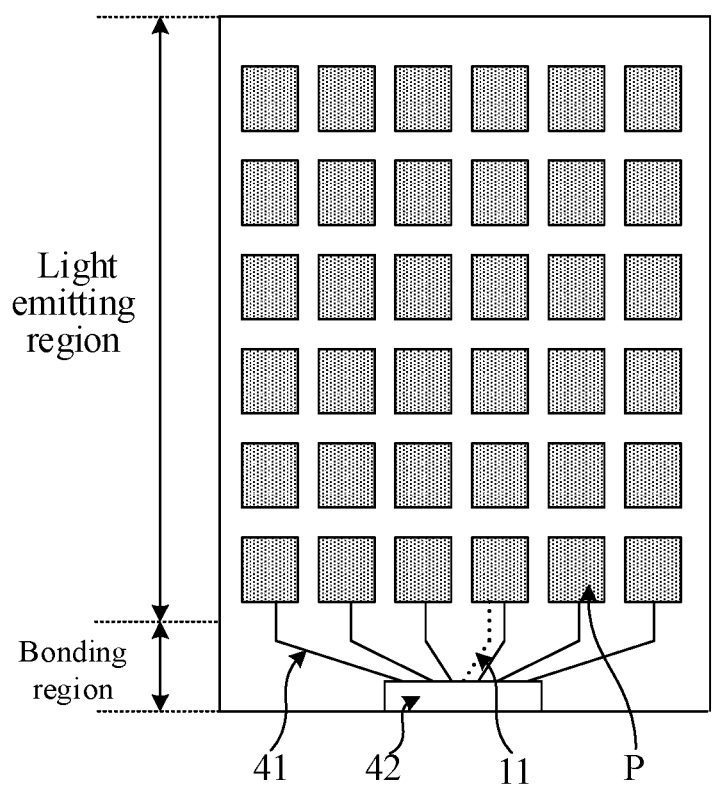
FIG. 2 is a second schematic diagram of a plane structure of a drive backplane provided in an embodiment of the present disclosure.
Figure 3:
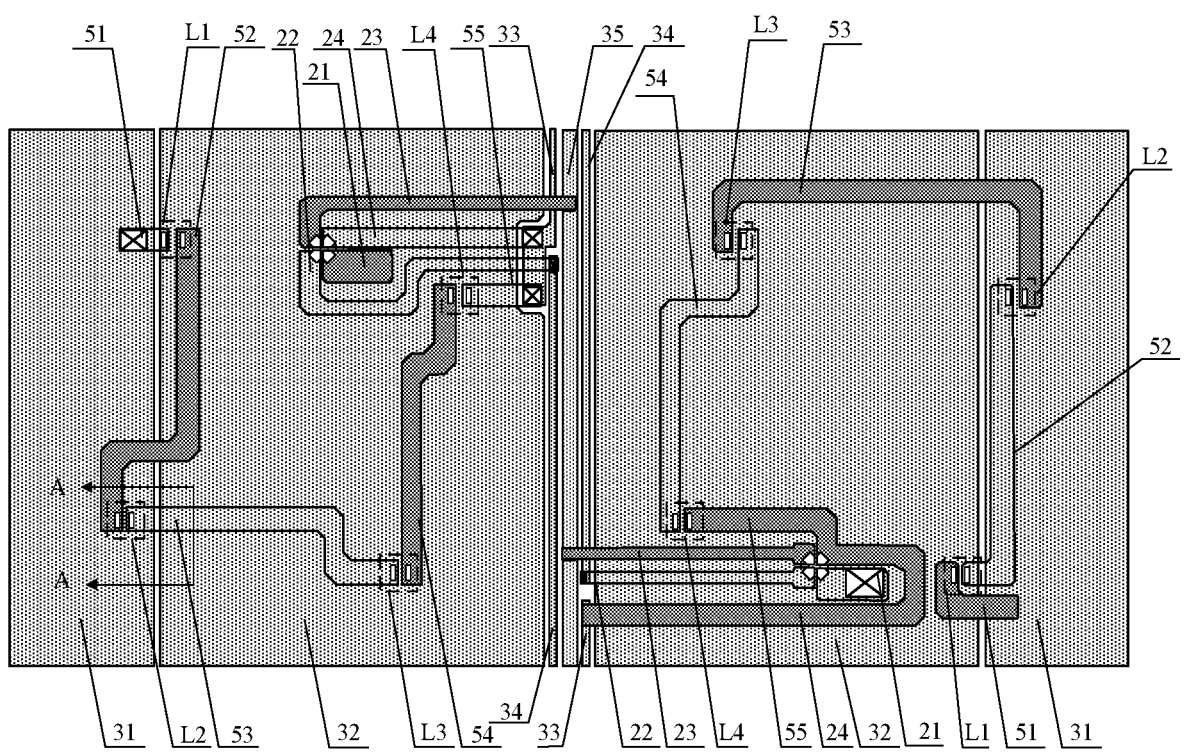
FIG. 3 is a first schematic diagram of a structure of a drive backplane provided in an embodiment of the present disclosure.
Figure 4:
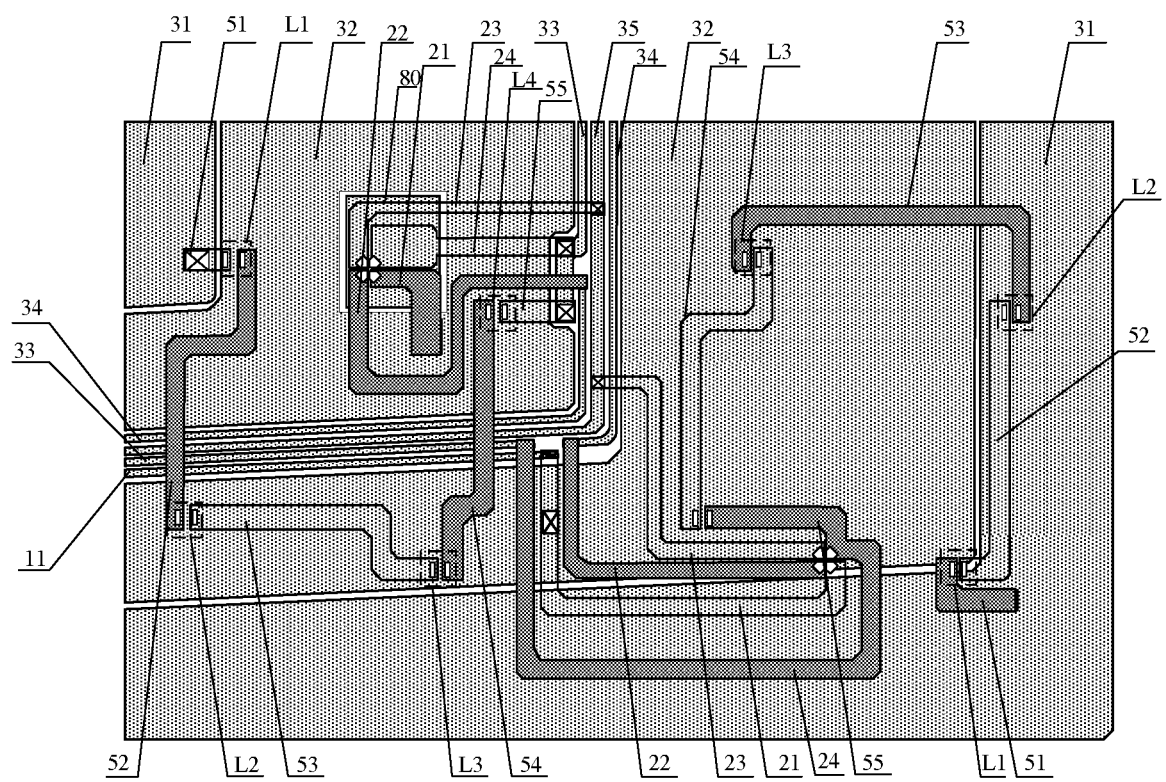
FIG. 4 is a second schematic diagram of a structure of a drive backplane provided in an embodiment of the present disclosure.
Figure 5:
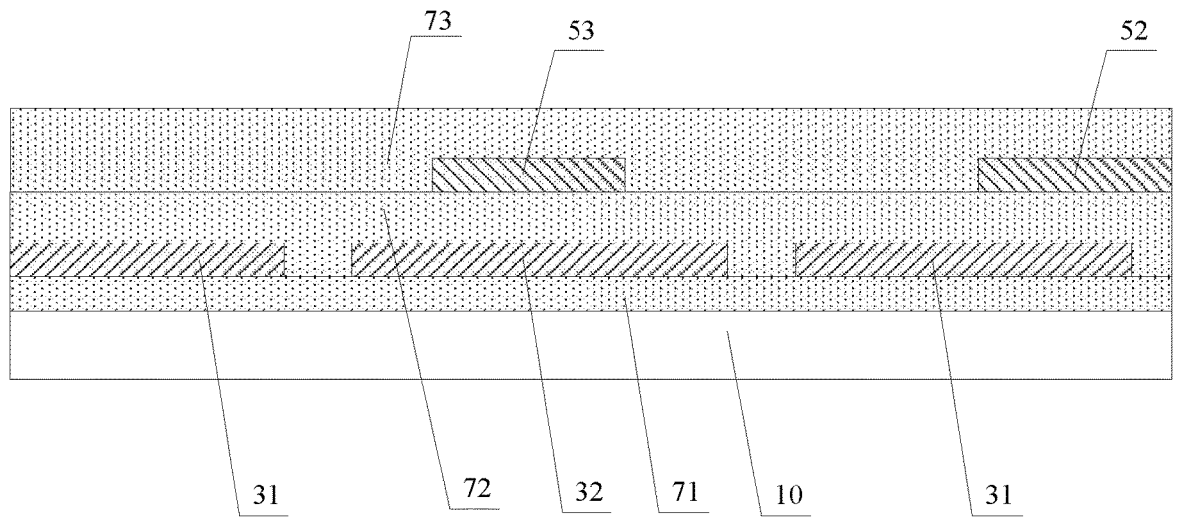
FIG. 5 is a cross-sectional view along an A-A direction of FIG. 3.

FIG. 1 is a first schematic diagram of a plane structure of a drive backplane provided in an embodiment of the present disclosure, FIG. 2 is a second schematic diagram of a plane structure of a drive backplane provided in an embodiment of the present disclosure, FIG. 3 is a first schematic diagram of a structure of a drive backplane provided in an embodiment of the present disclosure, FIG. 4 is a second schematic diagram of a structure of a drive backplane provided in an embodiment of the present disclosure, and FIG. 5 is a cross-sectional view along an A-A direction of FIG. 3. As shown in FIG. 1 to FIG. 5, in a plane parallel to the drive backplane, the drive backplane provided in the embodiment of the present disclosure may include a substrate 10, a first conductive layer disposed on one side of the substrate 10, and a second conductive layer disposed on one side of the first conductive layer facing away from the substrate 10.

As shown in FIG. 1 to FIG. 3, the substrate includes a light emitting region and a bonding region, and the light emitting region includes light emitting units P arranged in an array, each light emitting unit P includes a first signal line 32 and a pad 30 electrically connected with the first signal line.

As shown in FIG. 3 the first conductive layer includes the first signal line 32 and at least one signal detection line 11.

As shown in FIG. 3, the second conductive layer includes a pad 30; and the signal detection line 11 is electrically connected with a pad 30 of a light emitting unit.

In an exemplary embodiment, the substrate 10 may be a rigid substrate or a flexible substrate, wherein the rigid substrate may be, but is not limited to, one or more of glass, metal foils, and polychorinated biphenyls; and the flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, the first conductive layer is used for arranging various signal lines.

In an exemplary embodiment, a thickness of the first conductive layer is about 1.5 microns to 7 microns.

In an exemplary embodiment, the first conductive layer may be of a single-layer structure or a multi-layer structure. For example, copper may be used for the single-layer structure. For another example, stacked MoNb/Cu/MoNb or stacked MoNiTi/Cu/MoNiTi may be used for the multi-layer structure. For a stacked structure MoNb/Cu/MoNb, a bottom layer is made of a Molybdenum-Niobium alloy (MoNb), which may improve adhesion, and a thickness of the Molybdenum-Niobium alloy (MoNb) may be about 200 Å to 400 Å, e.g., 300 Å. An intermediate layer Cu is used for transmitting an electrical signal. A top layer is made of a Molybdenum-Niobium alloy (MoNb), which may prevent oxidation. A thickness of the Molybdenum-Niobium alloy (MoNb) may be about 100 to 300 angstroms, e.g., 200 Å.

In an exemplary embodiment, the second conductive layer is used for providing various pads, such as a pad for installing a functional element or a pad for installing a drive chip of a functional element. The second conductive layer may also be provided with a lead for connecting.

In an exemplary embodiment, a thickness of the second conductive layer is about 5000 angstroms to 7000 angstroms.

In an exemplary embodiment, the second conductive layer may be of a single-layer structure or a multi-layer structure. For example, copper may be used for the single-layer structure. For another example, stacked MoNb/Cu/CuNi may be used for the multi-layer structure. For a stacked structure MoNb/Cu/CuNi, a bottom layer is made of a Molybdenum-Niobium alloy MoNb, which may improve adhesion, and a thickness of the Molybdenum-Niobium alloy (MoNb) may be about 200 Å to 400 Å, e.g., 300 Å. An intermediate layer Cu is used for transmitting an electrical signal. A top layer is made of a Copper-Nickel alloy (CuNi), which may give consideration to anti-oxidation and die-bonding firmness, and a thickness of the Copper-Nickel alloy (CuNi) may be about 500 Å to 1000 Å.

In an exemplary embodiment, the top layer may also be made of nickel (Ni) or Indium Tin Oxide (ITO), which is not limited thereto in the present disclosure.

In an exemplary embodiment, the first signal line may be configured to provide a common voltage signal to a light emitting unit, and the common voltage signal may be a ground signal.

In an exemplary embodiment, the bonding region may be located on one side of the light emitting region, or may be located on multiple sides of the light emitting region. FIGS. 1 and 2 are illustrated by taking the bonding region being located on one side of the light emitting region as an example.

In an exemplary embodiment, a shape of the light emitting region may be set according to actual requirements. For example, a profile of the light emitting region may be a rectangle. Due to the shape of the light emitting region is rectangle, which makes it easier to achieve partition control of a backlight.

In an exemplary embodiment, a shape of a light emitting unit may be determined according to actual requirements. For example, a profile of the light emitting unit may be a rectangle. FIGS. 1 and 2 are illustrated by taking a light emitting unit being in a shape of a rectangle as an example, and a rectangle in FIG. 2 is an inclined rectangle.

In an exemplary embodiment, there may be M rows and N columns of light emitting units, wherein M is a positive integer greater than or equal to 1, and N is a positive integer greater than or equal to 1. For example, M may be 45 and N may be 80. Values of M and N depend on dimensions of the drive backplane and process requirements and are not limited thereto in the present disclosure.

In an exemplary embodiment, a quantity of signal detection lines 11 is determined according to actual requirements, which is not limited thereto in the present disclosure.

The drive backplane provided in the embodiment of the present disclosure includes a substrate, wherein the substrate includes a light emitting region and a bonding region, the light emitting region includes light emitting units arranged in an array, each light emitting unit includes a first signal line and a first pad connection line electrically connected with the first signal line; a first conductive layer disposed on one side of the substrate, including a first signal line and at least one signal detection line; and a second conductive layer disposed on one side of the first conductive layer facing away from the substrate, including a pad; wherein the signal detection line is electrically connected with the pad of the light emitting unit. The signal detection line located in the first conductive layer, provided in the present disclosure, is electrically connected with the first signal line through the pad of the light emitting unit, the first signal line may be used for detecting a voltage drop of a signal of the first signal line to adjust a signal of the drive backplane according to the voltage drop of the first signal line, thereby improving a display effect of the drive backplane, prolonging service life of the drive backplane, and improving performance of the drive backplane.

As shown in FIG. 1, the drive backplane provided in the exemplary embodiment further includes a bonding terminal 42 disposed on a substrate and located in the bonding region, and a flexible circuit board 50 electrically connected with the bonding terminal 42.

In an exemplary embodiment, a pad 30 of a light emitting unit is electrically connected with the bonding terminal 42 through the signal detection line 11.

As shown in FIG. 2, the drive backplane provided in the exemplary embodiment may further include a plurality of leads 41 located in the bonding region. Herein, one end of at least one lead is connected with a signal line in at least one light emitting unit and the other end is connected with the bonding terminal 42.

In an exemplary embodiment, the signal line may include a first signal line.

As shown in FIG. 1, the drive backplane provided in the exemplary embodiment may further include a control circuit 60. The control circuit 60 may be electrically connected with the bonding terminal 42 through the flexible circuit board 50.

In an exemplary embodiment, the control circuit 60 is configured to control the light emitting unit to emit light, and is further configured to receive a signal of the signal detection line and control the light emitting unit to emit light according to the signal of the signal detection line.

In an exemplary embodiment, the light emitting region may be divided into at least one light emitting sub-region. At least one signal detection line is electrically connected with a pad of at least one light emitting unit in each light emitting sub-region. FIG. 1 is illustrated by taking four light emitting sub-regions as an example.

In an exemplary embodiment, as shown in FIG. 1, one of the at least one signal detection line is electrically connected with a pad of one light emitting unit in each light emitting sub-region.

In an exemplary embodiment, one signal detection line 11 of the at least one signal detection line may be connected with at least one pad.

In an exemplary embodiment, one of the at least one signal detection line may be electrically connected with pads of any row of light emitting units in each light emitting sub-region.

In an exemplary embodiment, one of the at least one signal detection line is electrically connected with a pad of a light emitting unit located in a last row and a k-th column in each light emitting sub-region; $1 \leq i \leq m$, wherein m is a total number of columns of light emitting units in the light emitting sub-region.

In an exemplary embodiment, one of the at least one signal detection line may be electrically connected with a pad of a light emitting unit located in a last row and a last column in each light emitting sub-region.

In the present disclosure, one of the at least one signal detection line is electrically connected with the pad of the light emitting unit in the last row and the k-th column in each light emitting sub-region, so that a voltage drop of a first signal line from a farthest end to a nearest end may be detected, which may improve detection accuracy. Taking a case that a signal detection line may be electrically connected with pads of light emitting units in a last row in each light emitting sub-region as an example, FIG. 3 is a schematic diagram of two adjacent light emitting units except the last row, and FIG. 4 is a schematic diagram of two adjacent light emitting units in the last row, wherein one of the two adjacent light emitting units is connected with a signal detection line.

In an exemplary embodiment, a quantity of signal detection lines connected with each light emitting sub-region is determined according to detection accuracy, which is not limited thereto in the present disclosure.

In an exemplary embodiment, the drive backplane may be a whole backplane, and all light emitting sub-regions are disposed on one backplane.

In an exemplary embodiment, the drive backplane may include at least two drive sub-backplanes. Wherein, different drive sub-backplanes are disposed at intervals. Each drive backplane includes at least one light emitting sub-region.

In an exemplary embodiment, for each light emitting unit, an orthographic projection of a pad on the substrate is partially overlapped with an orthographic projection of the first signal line 32 on the substrate.

In an exemplary embodiment, an orthographic projection of the signal detection line 11 on the substrate is partially overlapped with an orthographic projection of a pad connected with the signal detection line 11 on the substrate.

As shown in FIG. 4, in an exemplary embodiment, the drive backplane may further include a first insulation layer 71 disposed between the substrate 10 and the first conductive layer, a second insulation layer 72 disposed between the first conductive layer and the second conductive layer, and a third insulation layer 73 disposed on one side of the second conductive layer away from the substrate.

In an exemplary embodiment, the first insulation layer 71 may be an inorganic insulation layer. The inorganic insulation layer may be made of any one or more of Silicon Oxide (SiOx), Silicon Nitride (SiNx), and Silicon Oxynitride (SiON), and may be a single-layer, a multi-layer, or a composite layer.

In an exemplary embodiment the second insulation layer 72 may include a first organic insulation layer and a first inorganic insulation layer; wherein the first organic insulation layer is disposed on a side of the first inorganic insulation layer close to the substrate. Herein, the first organic insulation layer may be made of polyimide. The first inorganic insulation layer may be made of any one or more of Silicon Oxide (SiOx), Silicon Nitride (SiNx), and Silicon Oxynitride (SiON), and may be a single-layer, a multi-layer, or a composite layer.

In an exemplary embodiment, the third insulation layer 73 may include a second organic insulation layer and a second inorganic insulation layer; wherein the second organic insulation layer is disposed on a side of the second inorganic insulation layer close to the substrate. Herein, the second organic insulation layer may be made of polyimide. The second inorganic insulation layer may be made of any one or more of Silicon Oxide (SiOx), Silicon Nitride (SiNx), and Silicon Oxynitride (SiON), and may be a single-layer, a multi-layer, or a composite layer.

In an exemplary embodiment, the second insulation layer is provided with a first via and a second via. Herein, the first via exposes a first signal line and the second via exposes a signal detection line.

In an exemplary embodiment, a first pad connection line 21 of a light emitting unit is electrically connected with the first signal line 32 through the first via and electrically connected with the signal detection line 11 through the second via.

In an exemplary embodiment, the first signal line 32 extends along a first direction.

Figure 6:
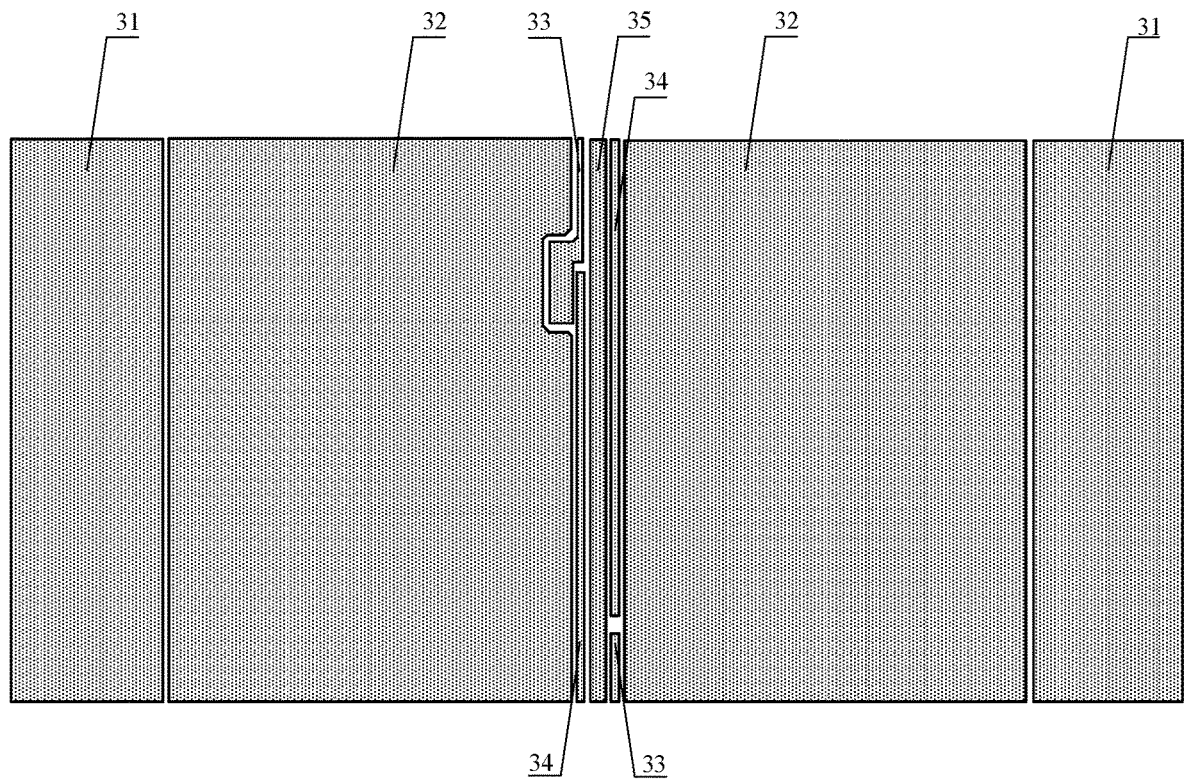
FIG. 6 is a schematic diagram of a structure of a first conductive layer.

FIG. 6 is a schematic diagram of a structure of the first conductive layer. As shown in FIG. 3, FIG. 4, and FIG. 6, in an exemplary embodiment, the light emitting unit may further include a second signal line 31, a third signal line 33, a fourth signal line 34, and a fifth signal line 35, which extend along the first direction. The second signal line 31 and the first signal line 32 are arranged along a second direction and the third signal line 33 and the fourth signal line 34 are arranged along the first direction, wherein the first direction and the second direction intersect.

In an exemplary embodiment, the first conductive layer further includes a second signal line 31, a third signal line 33, a fourth signal line 34, and a fifth signal line 35.

In an exemplary embodiment, as shown in FIGS. 3 and 4, the second signal line 31 is located on one side of the first signal line 32, the third signal line 33 and the fourth signal line 34 are located on one side of the first signal line 32 away from the second signal line 31, and the fifth signal line 35 is located on one side of the third signal line 33 away from the first signal line 32.

In an exemplary embodiment, the second signal line 31 may be configured to provide a drive voltage signal to a light emitting unit. The third signal line 33 outputs a drive signal and a relay signal, the drive signal may be a drive current for drive a light emitting element to emit light, the relay signal may be an address signal provided to another light emitting unit, and the another light emitting unit receive the relay signal as an input signal, thereby acquiring the address signal. The fourth signal line 34 may be configured to provide a first signal, e.g., an address signal, to a light emitting unit for gating a light emitting unit of a corresponding address. Among a plurality of light emitting units in the drive backplane, addresses of different light emitting units may be the same or different, and the address signal may be an 8-bit signal. The fifth signal line 35 may be configured to provide a second signal, e.g., a carrier signal and a duration signal, to a light emitting unit, wherein the carrier signal may be used for supplying electrical energy, and the duration signal may be used for controlling a light emitting duration of the light emitting unit so as to control its visual light emitting brightness.

In an exemplary embodiment, as shown in FIG. 4, the signal detection line 11 is disposed between a third signal line 33 and a first signal line 32 in a light emitting unit where a pad with which the signal detection line 11 is connected is located.

In an exemplary embodiment, as shown in FIGS. 3 and 4, a width of the first signal line 32 may be greater than a width of the second signal line 31.

In an exemplary embodiment, a width of the first signal line 32 may be about 5 mm to 7 mm.

In an exemplary embodiment, as shown in FIGS. 3 and 4, a width of the second signal line 31 may be greater than a width of the fifth signal line 35.

In an exemplary embodiment, a width of the second signal line 31 may be about 2 mm to 4 mm.

In an exemplary embodiment, as shown in FIGS. 3 and 4, a width of the fifth signal line 35 may be greater than a width of the third signal line 33.

In an exemplary embodiment, as shown in FIGS. 3 and 4, a width of the fifth signal line 35 may be greater than a width of the fourth signal line 34.

In an exemplary embodiment, the width of the fifth signal line 35 may be about 1.5 mm to 2 mm.

In an exemplary embodiment, the width of the third signal line 33 may be about 0.5 mm to 1.5 mm.

In an exemplary embodiment, the width of the fourth signal line 34 may be about 0.5 mm to 1.5 mm.

In an exemplary embodiment, as shown in FIGS. 3 and 4, a width of the signal detection line 11 may be less than the width of the fifth signal line 35.

In an exemplary embodiment, the width of the signal detection line 11 may be about 0.5 mm to 1.5 mm.

In an exemplary embodiment, the second insulation layer is provided with a third via to a sixth via. Herein, the third via exposes a second signal line, the fourth via exposes a fourth signal line, the fifth via exposes a fifth signal line, and the sixth via exposes a third signal line.

Figure 7:
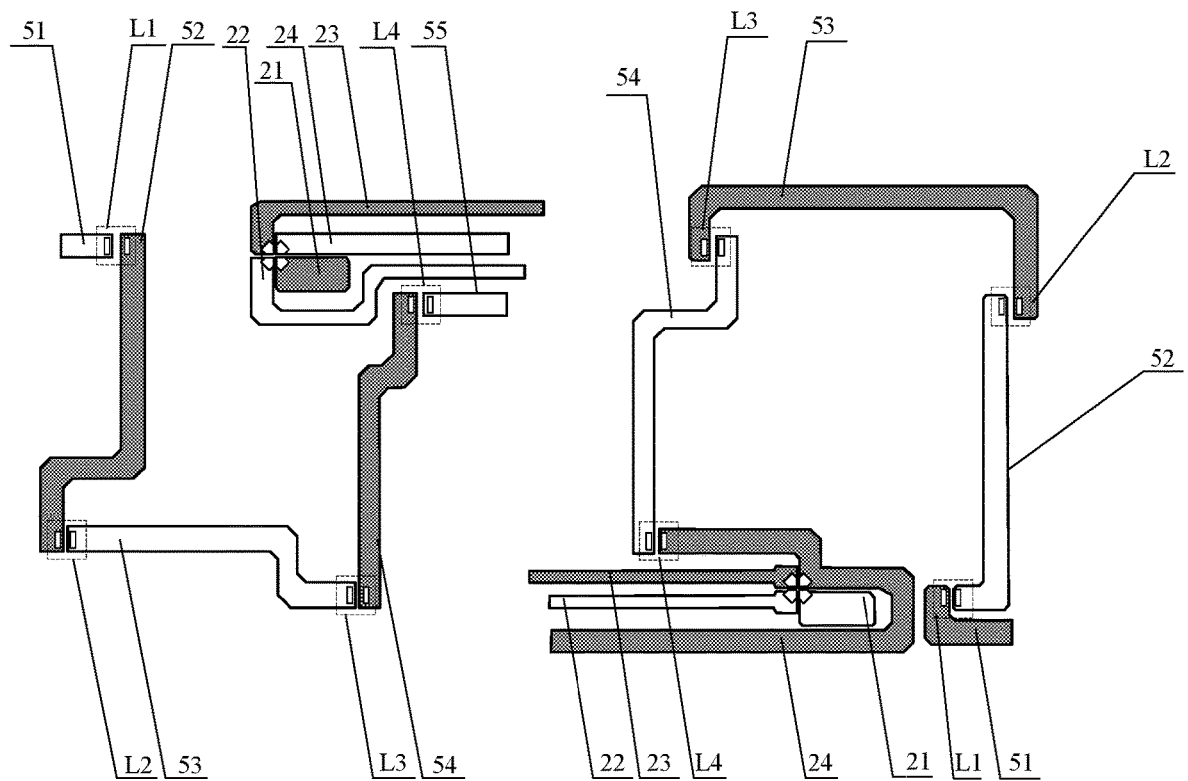
FIG. 7 is a schematic diagram of a structure of a second conductive layer.

FIG. 7 is a schematic diagram of a structure of the second conductive layer. As shown in FIG. 3, FIG. 4, and FIG. 7, in an exemplary embodiment, the light emitting unit may further include a first die-bonding region L1, a second die-bonding region L2, a third die-bonding region L3, a fourth die-bonding region L4, a first connection line 51, a second connection line 52, a third connection line 53, a fourth connection line 54, and a fifth connection line 55. Each die-bonding region includes a first terminal and a second terminal oppositely disposed at intervals, and the first terminal and the second terminal are configured to connect two electrodes of a same light emitting element.

In an exemplary embodiment, the second conductive layer may further include a first connection line, a second connection line, a third connection line, a fourth connection line, and a fifth connection line.

In an exemplary embodiment, as shown in FIGS. 3 and 4, a first end of the first connection line 51 is electrically connected with the second signal line 31, and a second end of the first connection line 51 extends to the first die-bonding region L1 and forms a first terminal in the first die-bonding region L1.

In an exemplary embodiment, as shown in FIGS. 3 and 4, a first end of the second connection line 52 extends to the first die-bonding region L1 and forms a second terminal in the first die-bonding region L1, and a second end of the second connection line 52 extends to the second die-bonding region L2 and forms a first terminal in the second die-bonding region L2.

In an exemplary embodiment, as shown in FIGS. 3 and 4, a first end of the third connection line 53 extends to the second die-bonding region L2 and forms a second terminal in the second die-bonding region L2, and a second end of the third connection line 53 extends to the third die-bonding region L3 and forms a first terminal in the third die-bonding region L3.

In an exemplary embodiment, as shown in FIGS. 3 and 4, a first end of the fourth connection line 54 extends to the third die-bonding region L3 and forms a second terminal in the third die-bonding region L3, and a second end of the fourth connection line 54 extends to the fourth die-bonding region L4 and forms a first terminal in the fourth die-bonding region L4.

In an exemplary embodiment, as shown in FIGS. 3 and 4, a first end of the fifth connection line 55 extends to the fourth die-bonding region L4 and forms a first terminal in the fourth die-bonding region L4, and a second end of the fifth connection line 55 is electrically connected with the third signal line 33.

In an exemplary embodiment, the first terminal and the second terminal of the first die-bonding region L1 are oppositely disposed at intervals, and the first terminal and the second terminal are configured to respectively connect two electrodes of a first light emitting element subsequently transferred, so as to achieve a connection between a first light emitting element and the drive backplane. A die-bonding region refers to a region where an electrode in a light emitting element is fixed.

In an exemplary embodiment, the first terminal and the second terminal of the second die-bonding region L2 are oppositely disposed at intervals, and the first terminal and the second terminal are configured to respectively connect two electrodes of a second light emitting element subsequently transferred, so as to achieve a connection between the second light emitting element and the drive backplane.

In an exemplary embodiment, as shown in FIGS. 3 and 4, the first terminal and the second terminal of the third die-bonding region L3 are oppositely disposed at intervals, and the first terminal and the second terminal are configured to respectively connect two electrodes of a third light emitting element subsequently transferred, so as to achieve a connection between the third light emitting element and the drive backplane.

In an exemplary embodiment, as shown in FIGS. 3 and 4, the first terminal and the second terminal of the fourth die-bonding region L4 are oppositely disposed at intervals, and the first terminal and the second terminal are configured to respectively connect two electrodes of a fourth light emitting element subsequently transferred, so as to achieve a connection between the fourth light emitting element and the drive backplane.

In an exemplary embodiment, the light emitting element may be a Micro LED.

In the present disclosure, four light emitting diodes connected in series may be installed through a plurality of connection lines in one light emitting unit. In an exemplary embodiment, a quantity of light emitting diodes installed in one light emitting unit may be multiple, such as 4, 5, 6, and 8. An arbitrary arrangement may be used for an arrangement of the multiple light emitting units, which is not limited in the present disclosure. FIGS. 3 and 4 are illustrated by taking four light emitting diodes being installed in one light emitting unit as an example.

As shown in FIG. 1, FIG. 3, and FIG. 4, in an exemplary embodiment, the pad may include a first pad connection line 21, a second pad connection line 22, a third pad connection line 23, a fourth pad connection line 24, a first input terminal Di, a second input terminal Pwr, an output terminal Out, and a common voltage terminal Gnd. Herein, the first pad connection line 21 and the second pad connection line 22 are arranged along the second direction, the second pad connection line 22 and the third pad connection line 23 are arranged along the first direction, the third pad connection line 23 and the fourth pad connection line 24 are arranged along the second direction, and the fourth pad connection line 24 and the first pad connection line 21 are arranged along the first direction. The first pad connection line 21 is located on a side of the second pad connection line 22 close to the fifth signal line.

In an exemplary embodiment, as shown in FIGS. 3 and 4, an orthographic projection of the first pad connection line 21 on the substrate is partially overlapped with an orthographic projection of the second signal line 31 on the substrate.

In an exemplary embodiment, as shown in FIGS. 3 and 4, an orthographic projection of the second pad connection line 22 on the substrate is partially overlapped with orthographic projections of the first signal line 32, the third signal line 33, and the fourth signal line 34 on the substrate.

In an exemplary embodiment, as shown in FIGS. 3 and 4, an orthographic projection of the third pad connection line 23 on the substrate is partially overlapped with orthographic projections of the first signal line 32, the third signal line 33, and the fifth signal line 35 on the substrate.

In an exemplary embodiment, as shown in FIGS. 3 and 4, an orthographic projection of the fourth pad connection line 24 on the substrate is partially overlapped with orthographic projections of the first signal line 32 and the third signal line 33 on the substrate.

Figure 8:
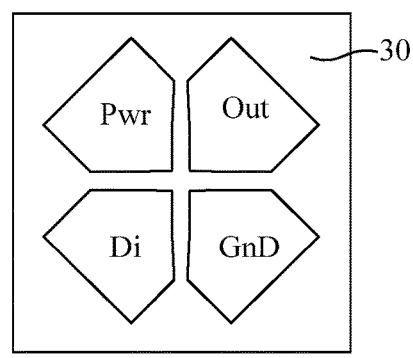
FIG. 8 is a schematic diagram of an arrangement of terminals of a pad.

FIG. 8 is a schematic diagram of an arrangement of terminals in a pad. In an exemplary embodiment, as shown in FIG. 8, the first input terminal Di may be connected with the fourth signal line 34 and is configured to receive a first signal provided by the fourth signal line 34, the first signal is, for example, an address signal, for gating a light emitting unit of a corresponding address. A display drive integrated circuit may know an address to be transmitted, by parsing the address signal. The second input terminal Pwr is connected with the fifth signal line 35 and configured to receive a second signal, e.g., a carrier signal and a duration signal. The common voltage terminal Gnd is connected with the first signal line 32 and configured to receive a common voltage signal. The output terminal Out is connected with the third signal line 33, and is configured to output a drive signal and a relay signal, the drive signal may be a drive current for driving a light emitting element to emit light, the relay signal may be an address signal provided to another light emitting unit, and the another light emitting unit receives the relay signal as an input signal, thereby acquiring the address signal.

In an exemplary embodiment, as shown in FIGS. 3 and 4, the first pad connection line 21 is electrically connected with the common voltage terminal Gnd and the first signal line 32, the second pad connection line 22 is electrically connected with the first input terminal Di and the fourth signal line 34 respectively, the third pad connection line 23 is electrically connected with the second input terminal Pwr and the fifth signal line 35 respectively, and the fourth pad connection line 24 is electrically connected with the output terminal Out and the third signal line 33 respectively.

In an exemplary embodiment, as in FIGS. 3 and 4, a side of the first signal line 32 close to the third signal line 33 is provided with an opening region.

As shown in FIG. 4, the first conductive layer is provided with a plurality of opening regions. The first conductive layer further includes a plurality of conductive islands 80, at least one opening region is provided with a conductive island 80, and an interval is provided between an outer periphery of the conductive islands 80 and the first signal line. The conductive island 80 and the first conductive layer are made of a same material, and it may also be understood that the first conductive layer is grooved annularly to form a separate conductive region, i.e. a conductive island 80. A plurality of pad connection lines above the opening region provided with the conductive island 80 are located right above the conductive island 80. Since the plurality of pad connection lines are located above the conductive island 80 and the interval is provided between the conductive island 80 and the first signal line, the first signal line will not be affected even if the plurality of pad connection lines are short-circuited with the conductive island 80.

In an exemplary embodiment, for each light emitting unit, the first connection line 51 is electrically connected with the second signal line 31 through a third via, the first pad connection line 21 is electrically connected with the first signal line 32 through a first via, and is electrically connected with the signal detection line 11 through a second via, the second pad connection line 22 is electrically connected with the fourth signal line 34 through a fourth via, the third pad connection line 23 is electrically connected with the fifth signal line 35 through a fifth via, and the fourth pad connection line 24 and the fifth pad connection line 55 are electrically connected with the third signal line 33 through a sixth via.

Figure 9:
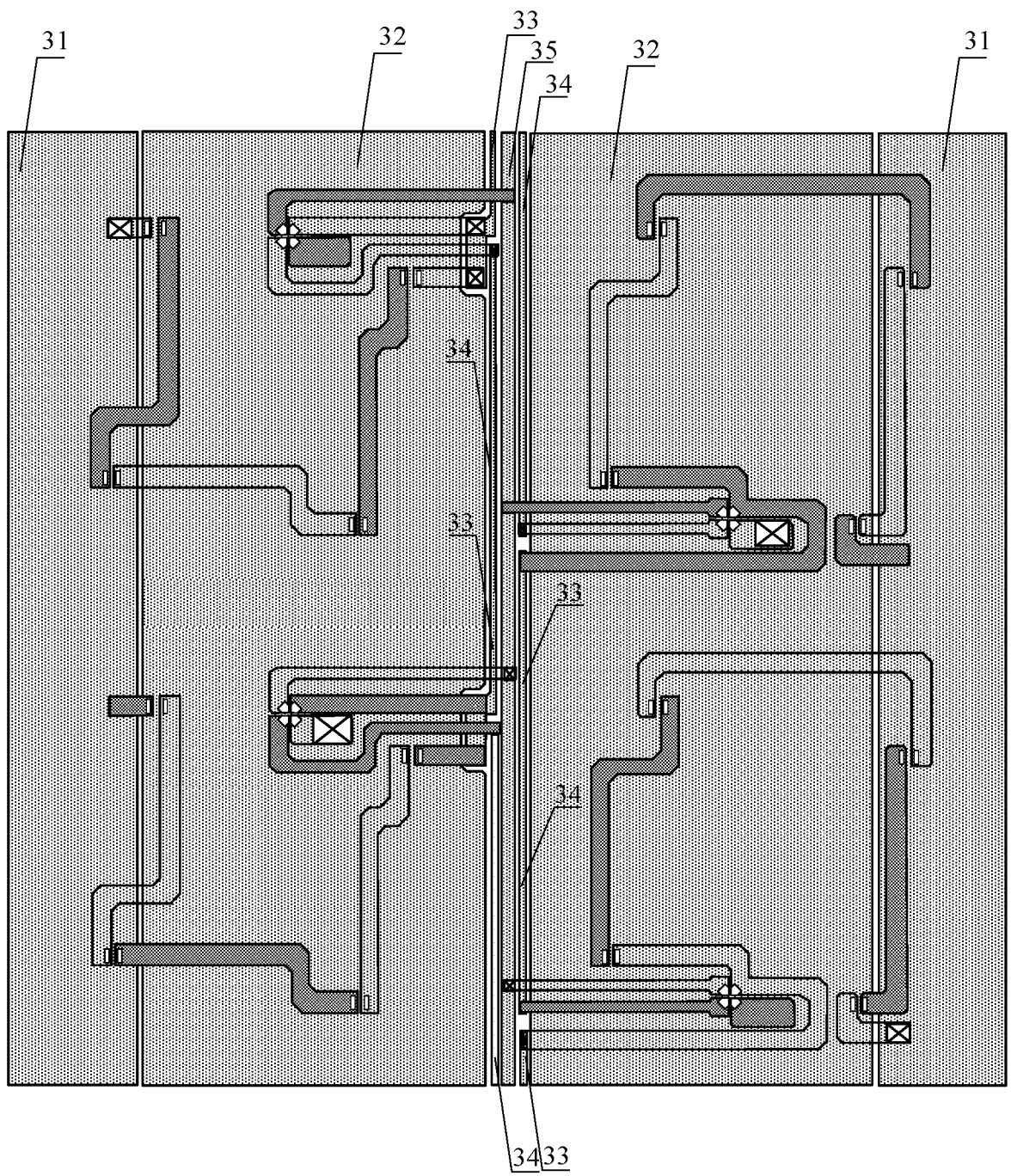
FIG. 9 is a third schematic diagram of a drive backplane provided in an exemplary embodiment.

FIG. 9 is a third schematic diagram of a drive backplane provided in an exemplary embodiment. The drive backplane provided in FIG. 9 includes light emitting units of two rows and two columns. As shown in FIG. 9, in a drive backplane provided in an exemplary embodiment, second signal lines 31 located in light emitting units of a same column may be a same signal line. Herein, a quantity of the second signal lines 31 may be N and N is a total number of columns of light emitting units.

As shown in FIG. 9, in a drive backplane provided in an exemplary embodiment, first signal lines 32 located in light emitting units of a same column may be a same signal line. Herein, a quantity of the first signal lines 32 may be N.

As shown in FIG. 9, in a drive backplane provided in an exemplary embodiment, fifth signal lines 35 located in light emitting units of a same column may be a same signal line.

As shown in FIG. 9, in a drive backplane provided in an exemplary embodiment, a fourth signal line 34 in a light emitting unit of an i-th row and a j-th column may be a same signal line as a third signal line 33 in a light emitting unit of an (i+1)-th row and a j-th column.

As shown in FIG. 9, in a drive backplane provided in an exemplary embodiment, a fifth signal line in a light emitting unit of an i-th row and a k-th column may be a same signal line as a fifth signal line in a light emitting units of an i-th row and a (k+1)-th column, $1 \le i \le M-1$, $1 \le j \le N$, k is an odd greater than or equal to 1 and less than or equal to N, and M is a total number of rows of light emitting units. Fifth signal lines in light emitting units of a first column are same signal lines as fifth signal lines in light emitting units of a second column. Fifth signal lines in light emitting units of a third column are same signal lines as fifth signal lines in light emitting units of a fourth column, and so on. A quantity of fifth signal lines 35 may be N/2.

In a drive backplane provided in an exemplary embodiment, light emitting units located in a same column have a same structure, and light emitting units located in adjacent columns may have different structures, or may be the same. FIG. 9 is illustrated by taking light emitting units of adjacent columns having different structures as an example.

In an exemplary embodiment, when structures of light emitting units of adjacent columns are different, a structure of a light emitting unit of an i-th row and a j-th column is the same as a structure of a light emitting unit of a i-th row and a (j+2)-th column.

As shown in FIGS. 3 and 4, in a drive backplane provided in an exemplary embodiment, a fifth connection line 55 and a fourth pad connection line 24 in a light emitting unit may be separately disposed or may be a same signal line. FIG. 3, FIG. 4, and FIG. 9 are illustrated by taking a case that a fifth connection lines 55 and a fourth pad connection lines 24 in a light emitting units of a first column are disposed separately, and a fifth connection lines 55 and a fourth pad connection lines 24 in a light emitting units of a second column are a same signal line as an example. An arrangement of the fifth connection line 55 and the fourth pad connection line 24 in the light emitting unit is determined according to a layout of signal lines in the light emitting unit.

In an exemplary embodiment, as shown in FIG. 3, the first connection line 51 may be in a shape of a straight line and extends along the second direction. A first end of a first connection part is electrically connected with the second signal line, and a second end of the first connection part extends to the first die-bonding region and forms a first terminal in the first die-bonding region.

In an exemplary embodiment, as in FIG. 3, the second connection line 52 may include a first connection part, a second connection part, and a third connection part. Herein, the first connection part extends along the first direction, and an orthographic projection of the first signal line on the substrate covers an orthographic projection of the first connection part on the substrate, a first end of the first connection part extends to the first die-bonding region, and forms a second terminal in the first die-bonding region, and a second end of the first connection part is electrically connected with a first end of the second connection part. The second connection part extends along the second direction, and an orthographic projection of the second connection part on the substrate is partially overlapped with orthographic projections of the first signal line and the second signal line on the substrate. A second end of the second connection part is electrically connected with a first end of the third connection part. The third connection part extends along the first direction, an orthographic projection of the second signal line on the substrate covers an orthographic projection of the third connection part on the substrate, a second end of the third connection part extends to the second die-bonding region and forms a first terminal in the second die-bonding region.

In an exemplary embodiment, as shown in FIG. 3, the third connection line 53 may include a first connection part, a second connection part, and a third connection part. Herein, the first connection part extends along the second direction, and an orthographic projection of the first connection part on the substrate is overlapped with orthographic projections of the first signal line and the second signal line on the substrate. A first end of the first connection part extends to the second die-bonding region and forms a second terminal in the second die-bonding region. A second end of the first connection part is electrically connected with a first end of the second connection part. The second connection part extends along the first direction, and an orthographic projection of the first signal line on the substrate covers an orthographic projection of the second connection part on the substrate, and a second end of the second connection part is connected with a first end of the third connection part. The third connection part extends along the second direction, the orthographic projection of the first signal line on the substrate covers an orthographic projection of the third connection part on the substrate, a second end of the third connection part extends to the third die-bonding region and forms a first terminal in the third die-bonding region.

In an exemplary embodiment, as shown in FIG. 3, an orthographic projection of the first signal line 32 on the substrate covers an orthographic projection of the fourth connection line 54 on the substrate. The fourth connection line 54 may include a first connection part, a second connection part, and a third connection part. Herein, the first connection part extends along the first direction, and a first end of the first connection part extends to the third die-bonding region and forms a second terminal in the third die-bonding region. A second end of the first connection part is electrically connected with a first end of the second connection part. The second connection part extends along the second direction, and a second end of the second connection part is connected with a first end of the third connection part. The third connection part extends along the first direction, and a second end of the third connection part extends to the fourth die-bonding region and forms a first terminal in the fourth die-bonding region.

In an exemplary embodiment, as shown in FIG. 3, the fifth connection line 55 may be in a shape of a straight line. An orthographic projection of the fifth connection line on the substrate is partially overlapped with orthographic projections of the first signal line and the third signal line on the substrate. A first end of the fifth connection line 55 extends to the fourth die-bonding region and forms a second terminal in the fourth die-bonding region L4, and a second end of the fifth connection line 55 is electrically connected with the third signal line 33.

In an exemplary embodiment, as shown in FIG. 3, the first pad connection line 21 may be in a shape of a straight line and extends along the second direction, and an orthographic projection of the first signal line 32 on the substrate covers an orthographic projection of the first pad connection line 21 on the substrate. The first pad connection line 21 is connected with the common voltage terminal GnD and the first signal line 32 respectively, wherein 1≤m≤M−1.

In an exemplary embodiment, as shown in FIG. 4, the first pad connection line 21 may include a first connection part and a second connection part. Herein, the first connection part extends along the second direction, and an orthographic projection of the first connection part on the substrate is not overlapped with an orthographic projection of the first signal line on the substrate. The first connection part is connected with the common voltage terminal GnD and the second connection part respectively. The second connection part extends along the first direction, and an orthographic projection of the second connection part on the substrate is partially overlapped with the orthographic projection of the first signal line on the substrate. The second connection part is connected with the first signal line.

In an exemplary embodiment, as shown in FIG. 3, the second pad connection line 22 may include a first connection part, a second connection part, a third connection part, and a fourth connection part. Herein, the first connection part extends along the first direction, and the orthographic projection of the first signal line on the substrate covers an orthographic projection of the first connection part on the substrate. The first connection part is connected with the second connection part and the first input terminal. The second connection part extends along the second direction, and the orthographic projection of the first signal line on the substrate covers an orthographic projection of the second connection part on the substrate. The second connection part is connected with the third connection part. The third connection part extends along the first direction, and the orthographic projection of the first signal line on the substrate covers an orthographic projection of the third connection part on the substrate. The third connection part is connected with the fourth connection part. The fourth connection part extends along the second direction, and an orthographic projection of the fourth connection part on the substrate is partially overlapped with the orthographic projection of the first signal line on the substrate, the orthographic projection of the third signal line on the substrate and the orthographic projection of the fourth signal line on the substrate. The fourth connection part is connected with the fourth signal line.

In an exemplary embodiment, as shown in FIG. 3, the third pad connection line 23 may include a first connection part and a second connection part. Herein, the first connection part extends along the first direction, and the orthographic projection of the first signal line on the substrate covers an orthographic projection of the first connection part on the substrate. The first connection part is connected with the second connection part and the second input terminal. The second connection part extends along the second direction, and an orthographic projection of the second connection part on the substrate is partially overlapped with orthographic projections of the first signal line, the third signal line, and the fifth signal line on the substrate. The second connection part is connected with the fifth signal line.

In an exemplary embodiment, as shown in FIG. 3, the fourth pad connection line 24 may be in a shape of a straight line and extends along the second direction, and an orthographic projection of the fourth pad connection line 24 on the substrate is partially overlapped with orthographic projections of the first signal line and the third signal line on the substrate. The fourth pad connection line 24 is connected with the output terminal Out and the third signal line 33 respectively.

In an exemplary embodiment, as shown in FIG. 3, the first connection line 51 may include a first connection part and a second connection part. Herein, the first connection part extends along the first direction, and the orthographic projection of the first signal line on the substrate covers an orthographic projection of the first connection part on the substrate. A first end of the first connection part extends to the first die-bonding region and forms a first terminal in the first die-bonding region. A second end of the first connection part is connected with a first end of the second connection part. The second connection part extends along the second direction, and an orthographic projection of the second connection part on the substrate is partially overlapped with orthographic projections of the second signal line and the first signal line on the substrate. A second end of the second connection part is electrically connected with the second signal line 31.

In an exemplary embodiment, as shown in FIG. 3, the second connection line may include a first connection part and a second connection part. Herein, the first connection part extends along the second direction, and an orthographic projection of the first connection part on the substrate is overlapped with orthographic projections of the first signal line and the second signal line on the substrate. A first end of the first connection part extends to the first die-bonding region and forms a second terminal in the first die-bonding region. A second end of the first connection part is electrically connected with a first end of the second connection part. The second connection part extends along the first direction, and an orthographic projection of the second signal line on the substrate covers an orthographic projection of the second connection part on the substrate. A second end of the second connection part extends to the second die-bonding region and forms a first terminal in the second die-bonding region.

In an exemplary embodiment, as shown in FIG. 3, the third connection line may include a first connection part, a second connection part, and a third connection part. Herein, the first connection part extends along the first direction, and an orthographic projection of the second signal line on the substrate covers an orthographic projection of the first connection part on the substrate. A first end of the first connection part extends to the second die-bonding region and forms a second terminal in the second die-bonding region. A second end of the first connection part is electrically connected with a first end of the second connection part. The second connection part extends along the second direction, and an orthographic projection of the second connection part on the substrate is partially overlapped with orthographic projections of the first signal line and the second signal line on the substrate. A second end of the second connection part is connected with a first end of the third connection part. The third connection part extends along the first direction, and an orthographic projection of the first signal line on the substrate covers an orthographic projection of the third connection part on the substrate. A second end of the third connection part extends to the third die-bonding region and forms a first terminal in the third die-bonding region.

In an exemplary embodiment, as shown in FIG. 3, an orthographic projection of the first signal line on the substrate covers an orthographic projection of the fourth connection line on the substrate. The fourth connection line 54 may include a first connection part, a second connection part, and a third connection part. Herein, the first connection part extends along the first direction. A first end of the first connection part extends to the third die-bonding region and forms a second terminal in the third die-bonding region. A second end of the first connection part is electrically connected with a first end of the second connection part. The second connection part extends along the second direction. A second end of the second connection part is connected with a first end of the third connection part. The third connection part extends along the first direction. A second end of the third connection part extends to the fourth die-bonding region and forms a first terminal in the fourth die-bonding region.

In an exemplary embodiment, as shown in FIG. 3, an orthographic projection of the first signal line on the substrate covers an orthographic projection of the fifth connection line on the substrate. The fifth connection line 55 may include a first connection part and a second connection part. Herein, the first connection part extends along the second direction. A first end of the first connection part extends to the fourth die-bonding region and forms a second terminal in the fourth die-bonding region. A second end of the first connection part is electrically connected with a first end of the second connection part. The second connection part extends along the first direction. A second end of the second connection part is electrically connected with the fourth pad connection line.

In an exemplary embodiment, as shown in FIG. 3, the first pad connection line 21 may be in a shape of a straight line and extends along the second direction, and an orthographic projection of the first signal line 32 on the substrate covers an orthographic projection of the first pad connection line 21 on the substrate. The first pad connection line 21 is connected with the common voltage terminal GnD and the first signal line 32 respectively.

In an exemplary embodiment, as shown in FIG. 4, the first pad connection line 21 may include a first connection part, a second connection part, and a third connection part. Herein, the first connection part extends along the first direction, and an orthographic projection of the first connection part on the substrate is partially overlapped with orthographic projections of the second signal line, the first signal line, and the signal detection line on the substrate. The first connection part extends along the first direction and is connected with the common voltage terminal GnD and the second connection part. The second connection part extends along the second direction, and an orthographic projection of the second signal line on the substrate covers an orthographic projection of the second connection part on the substrate. The third connection portion extends along the first direction, and an orthographic projection of the third connection portion on the substrate is partially overlapped with orthographic projections of the second signal line, the first signal line, and the signal detection line on the substrate. The third connection part is connected with the first signal line and the signal detection line.

In an exemplary embodiment, as shown in FIG. 3, the second pad connection line 22 may be a straight-shaped line and extends along the first direction. An orthographic projection of the second pad connection line 22 on the substrate is partially overlapped orthographic projections of the first signal line 32 and the fourth signal line 34 on the substrate. The second pad connection line 22 is connected with the first input terminal Di and the fourth signal line 34 respectively.

In an exemplary embodiment, as shown in FIG. 4, the second pad connection line 22 may include a first connection part and a second connection part. Herein, the first connection part extends along the second direction, and an orthographic projection of the first connection part on the substrate is partially overlapped with orthographic projections of the second signal line and the first signal line on the substrate. The first connection part is connected with the first input terminal Di and the second connection part. The second connection part extends along the first direction, and an orthographic projection of the second connection part on the substrate is partially overlapped with orthographic projections of the first signal line and the fourth signal line on the substrate. The second connection part is connected with the fourth signal line.

In an exemplary embodiment, as shown in FIG. 3, the third pad connection line 23 may be a straight-shaped line and extends along the first direction. An orthographic projection of the third pad connection line 23 on the substrate is partially overlapped orthographic projections of the first signal line 32, the fourth signal line 34, and the fifth signal line 35 on the substrate. The third pad connection line 23 is connected with the second input terminal Pwr and the fifth signal line 35 respectively.

In an exemplary embodiment, as shown in FIG. 3, the third pad connection line 23 may include a first connection part, a second connection part, and a third connection part. Herein, the first connection part extends along the second direction, and an orthographic projection of the first signal line on the substrate covers an orthographic projection of the first connection part on the substrate. The first connection part is connected with the second input terminal and the second connection part. The second connection part extends along the first direction, and the orthographic projection of the first signal line on the substrate covers an orthographic projection of the second connection part on the substrate. The second connection part is connected with the third connection part. The third connection part extends along the second direction, and an orthographic projection of the third connection part on the substrate is partially overlapped with orthographic projections of the first signal line, the fourth signal line, and the fifth signal line on the substrate. The third connection part is connected with the fifth signal line.

In an exemplary embodiment, as shown in FIG. 3, an orthographic projection of the fourth pad connection line on the substrate is partially overlapped with orthographic projections of the first signal line and the third signal line on the substrate. The fourth pad connection line may include a first connection part, a second connection part, and a third connection part. Herein, the first connection part extends along the second direction, and an orthographic projection of the first signal line on the substrate covers an orthographic projection of the first connection part on the substrate. The first connection part is connected with the second connection part of the fifth connection line and the second connection part of the fourth pad connection line respectively. The second connection part extends along the first direction. The orthographic projection of the first signal line on the substrate covers an orthographic projection of the second connection part on the substrate. The second connection part is connected with the third connection part. The third connection part extends along the second direction, and an orthographic projection of the third connection part on the substrate is partially overlapped with orthographic projections of the first signal line and the third signal line on the substrate. The third connection part is connected with the third signal line.

In an exemplary embodiment, as shown in FIG. 4, the fourth pad connection line may include a first connection part, a second connection part, a third connection part, and a fourth connection part. Herein, the first connection part extends along the second direction, and an orthographic projection of the first signal line on the substrate covers an orthographic projection of the first connection part on the substrate. The first connection part is connected with the second connection part of the fifth connection line and the second connection part of the fourth pad connection line respectively. The second connection part extends along the first direction, and an orthographic projection of the second connection part on the substrate is partially overlapped with orthographic projections of the first signal line and the second signal line on the substrate. The second connection part is connected with the third connection part. The third connection part extends along the second direction, and an orthographic projection of the second signal line on the substrate covers an orthographic projection of the third connection part on the substrate. The third connection part is connected with the fourth connection part. The fourth connection part extends along the first direction, and an orthographic projection of the fourth connection part on the substrate is partially overlapped with orthographic projections of the second signal line, the first signal line, the third signal line, and the signal detection line on the substrate. The fourth connection part is connected with the third signal line.

In an exemplary embodiment, a shape of the first connection line depends on a positional relationship of four light emitting elements in a light emitting unit.

In an exemplary embodiment, a shape of the first pad connection line is determined according to a layout of a signal of a light emitting unit and a connection between the first pad connection line in the light emitting unit and the signal detection line.

In an exemplary embodiment, a shape of the second pad connection line is determined according to a layout of a signal of a light emitting unit and a connection between the first pad connection line in the light emitting unit and the signal detection line.

In an exemplary embodiment, a shape of the third pad connection line is determined according to a layout of a signal of a light emitting unit and a connection between the first pad connection line in the light emitting unit and the signal detection line.

In an exemplary embodiment, a shape of the fourth pad connection line is determined according to a layout of a signal of a light emitting unit and a connection between the first pad connection line in the light emitting unit and the signal detection line.

As shown in FIG. 4, in an exemplary embodiment, when the signal detection line 11 is electrically connected with the first pad connection line 21 in a light emitting unit in a last row, an angle between an extension direction of the signal detection line 11 and the first direction is greater than or equal to 90 degrees and less than 180 degrees.

In an exemplary embodiment, the drive backplane may include a plurality of light emitting unit groups, each of which includes a plurality of light emitting units. In each light emitting unit group, a first input terminal Di of a circuit pad 30 in one light emitting unit is connected with the fourth signal line 34 through a connection line, and a first input terminal Di of another light emitting unit receives a relay signal outputted from an output terminal Out of a light emitting unit in a same column of a previous row as a first input signal. Thus, for one light emitting unit group, only one connection line is needed to provide one first signal (address signal), so that all light emitting units in the light emitting unit group may obtain respective address signals, thereby greatly reducing a quantity of signal lines, saving wiring space, and simplifying a control mode.

In an exemplary embodiment, a two-period drive mode may be adopted for a light emitting unit. The light emitting unit may output, during a first period, a relay signal by through an output terminal Out according to a first signal received by a first input terminal Di and a second signal received by a second input terminal Pwr, and provide, during a second period, a drive signal to a plurality of light emitting diodes connected in series in order through the output terminal Out. For example, during the first period, the output terminal Out outputs a relay signal which is provided to another light emitting unit, so that the another light emitting unit obtains an address signal. During the second period, the output terminal Out outputs a drive signal provided to the plurality of light emitting diodes connected in series in order, so that the light emitting diodes emit light during the second period. In an exemplary embodiment, the first period and the second period are different periods, and the first period may be earlier than the second period. For example, the first period may be continuously connected with the second period, and end time of the first period is start time of the second period. For another example, there may be another period between the first period and the second period, the another period may be used for achieving another required function, and the another period may only be used for separating the first period from the second period, so as to prevent signals of the output terminal Out in the first period and the second period from interfering with each other.

In an exemplary embodiment, a quantity and an arrangement of light emitting unit groups on the drive backplane, a quantity and an arrangement of a plurality of light emitting units within a light emitting unit group, and a quantity and an arrangement of a plurality of light emitting diodes within a light emitting unit, etc., may be set according to actual conditions, which are not limited thereto in the present disclosure.

Exemplary description is made below through a preparation process of the drive backplane. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a substrate by using deposition, coating, or another process. If the "thin film" does not need a patterning process in an entire preparation process, the "thin film" may also be referred to as a "layer". If the "thin film" needs the patterning process in the entire preparation process, it is referred to as a "thin film" before the patterning process, and is referred to as a "layer" after the patterning process. The "layer" after the patterning process contains at least one "pattern". "A and B are disposed in a same layer" in the present disclosure means that A and B are formed simultaneously through a same patterning processes, and a "thickness" of a film layer is a dimension of the film layer in a direction perpendicular to the drive backplane. In an exemplary embodiment of the present disclosure, "an orthogonal projection of A includes an orthogonal projection of B" refers to that a boundary of the orthogonal projection of B falls within a boundary of the orthogonal projection of A, or the boundary of the orthogonal projection of A is overlapped with the boundary of the orthogonal projection of B.

In an exemplary embodiment, the preparation process of the drive backplane may include following operations.

Figure 10:
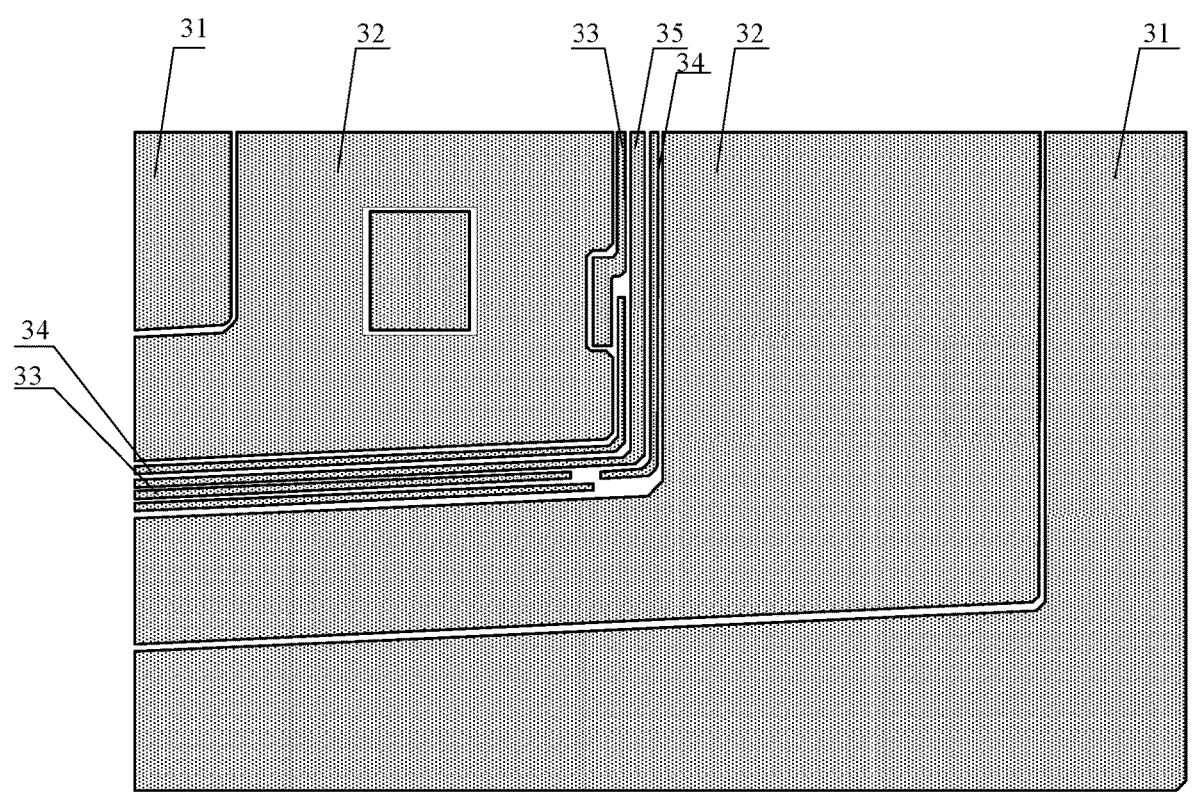
FIG. 10 is a schematic diagram after a first conductive layer is formed.

(1) A pattern of a first conductive layer is formed. Forming the pattern of the first conductive layer may include: a first insulation thin film and a first metal thin film are sequentially deposited on the substrate, the first metal thin film is patterned through a patterning process, a first insulation layer disposed on the substrate 10 and the pattern of the first conductive layer disposed on the first insulation layer are formed, wherein the pattern of the first conductive layer at least includes the second signal line 31, the first signal line 32, the third signal line 33, the fourth signal line 34, and the fifth signal line 35 as shown in FIGS. 6 and 10, FIG. 10 is a schematic diagram after the first conductive layer is formed. FIG. 6 is illustrated by taking a case that two light emitting units are not connected with a signal detection line as an example, and FIG. 10 is illustrated by taking a case that one light emitting unit is not connected with a signal detection line and the other light emitting unit is connected with the signal detection line an example.

In an exemplary embodiment, as shown in FIG. 6, when the two light emitting units are not connected with the signal detection line, the second signal line 31, the first signal line 32, the third signal line 33, the fourth signal line 34, and the fifth signal line 35 extend along the first direction.

In an exemplary embodiment, the first insulation thin film may be deposited in a Chemical Vapor Deposition (CVD) manner, and the first metal thin film may be deposited in a magnetron sputter (Sputter) manner.

In an exemplary embodiment, the first conductive layer may be a multi-layer composite structure, and includes a first sub-layer (a bottom layer on a side close to the substrate), a second sub-layer (a middle layer), and a third sub-layer (a top layer on a side away from the substrate) that are stacked. The first sub-layer may be made of a Molybdenum-Niobium alloy (MoNb) for improving adhesion, the second sub-layer may be made of Copper (Cu) for reducing a resistance, and the third sub-layer may be made of MoNb for preventing oxidation, forming a stacked structure of MoNb/Cu/MoNb.

In an exemplary embodiment, a following manner may also be used for this process. Firstly, a first insulation thin film is deposited on a substrate to form a first insulation layer disposed on the substrate, then a first sub-layer as a seed layer is formed on the first insulation layer to improve a grain nucleation density, then a second sub-layer is electroplated on the first sub-layer through an electroplating process, and then a third sub-layer as an anti-oxidation layer is formed on the second sub-layer. The first sub-layer may be made of MoNiTi, the second sub-layer may be made of Copper (Cu), and the third sub-layer may be made of MoNiTi.

In an exemplary embodiment, a negative photoresist may be used for a process for forming the first conductive layer.

Figure 11:
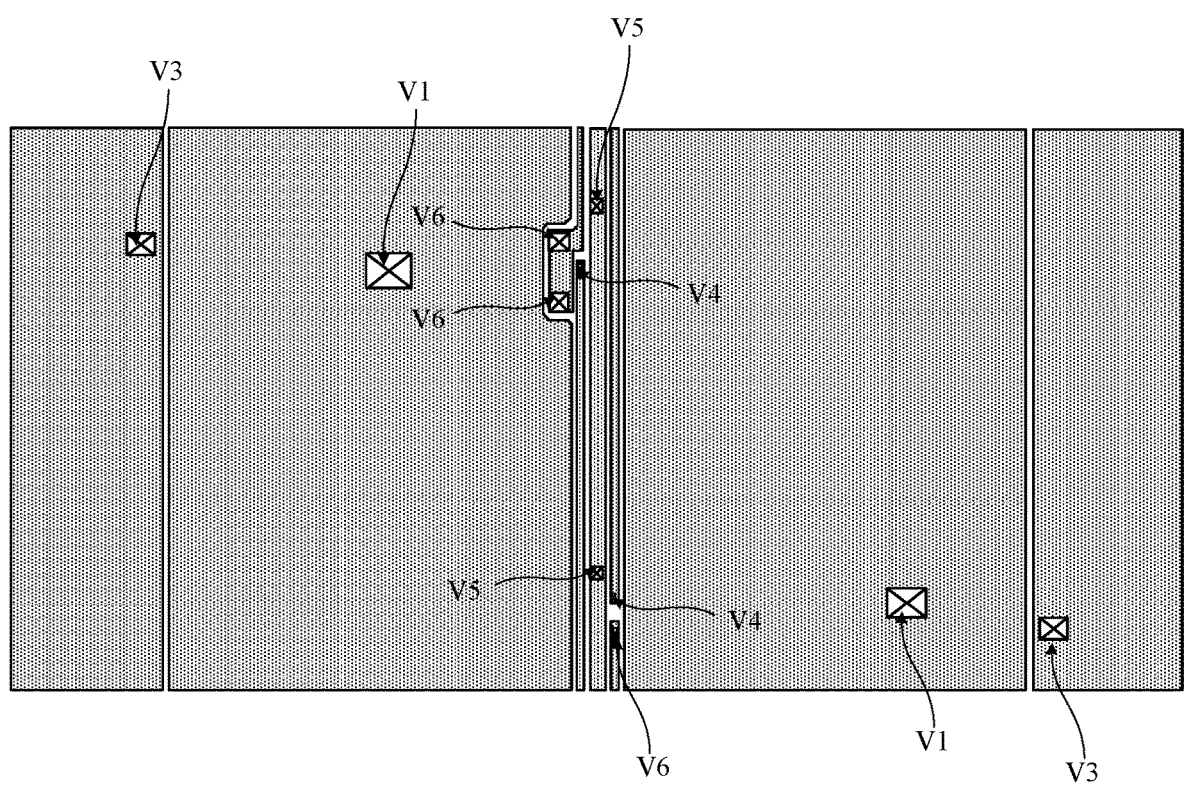
FIG. 11 is a first schematic diagram after a third insulation layer is formed.
Figure 12:
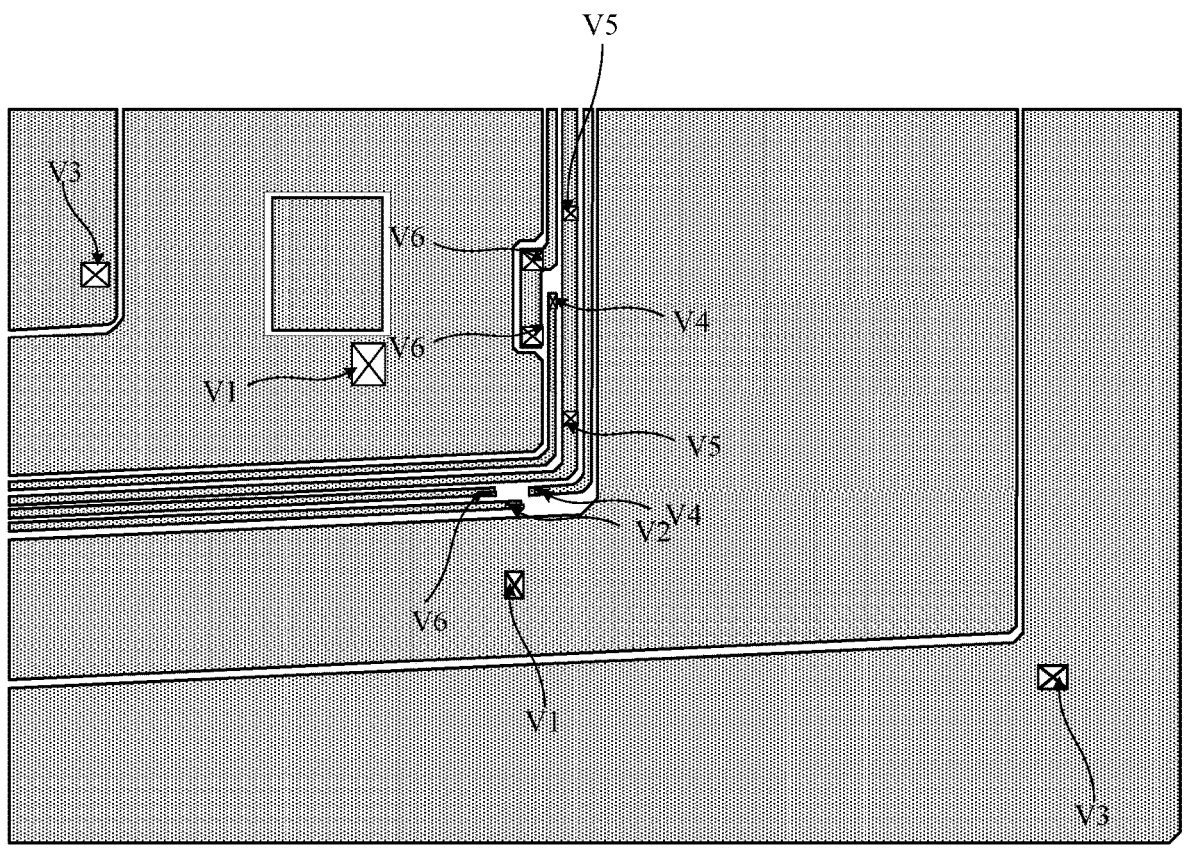
FIG. 12 is a second schematic diagram after a third insulation layer is formed.

(2) A pattern of a second insulation layer is formed. Forming the pattern of the second insulation layer may include: on the substrate where the aforementioned pattern is formed, firstly, a second insulation thin film is deposited, the pattern of the second insulation layer covering the pattern of the first conductive layer is formed, the second insulation layer is formed, the second insulation layer 72 is patterned through a patterning process to form a pattern of a plurality of vias. The plurality of vias may at least include a first via V1, a second via V2, a third via V3, a fourth via V4, a fifth via V5, and a sixth via V6, as shown in FIGS. 11 and 12. FIG. 11 is a first schematic diagram after the third insulation layer is formed, and FIG. 12 is a second schematic diagram after the third insulation layer is formed. FIG. 11 is illustrated by taking a case that two light emitting units are not connected with a signal detection line as an example, and FIG. 12 is illustrated by taking a case that one light emitting unit is not connected with a signal detection line and the other light emitting unit is connected with the signal detection line as an example.

In an exemplary embodiment, the first via V1 exposes the first signal line 32, the second via V2 exposes the signal detection line 11, the third via V3 exposes the second signal line 31, the fourth via V4 exposes the fourth signal line 34, the fifth via V5 exposes the fifth signal line 35, and the sixth via V6 exposes the third signal line 33.

Figure 13:
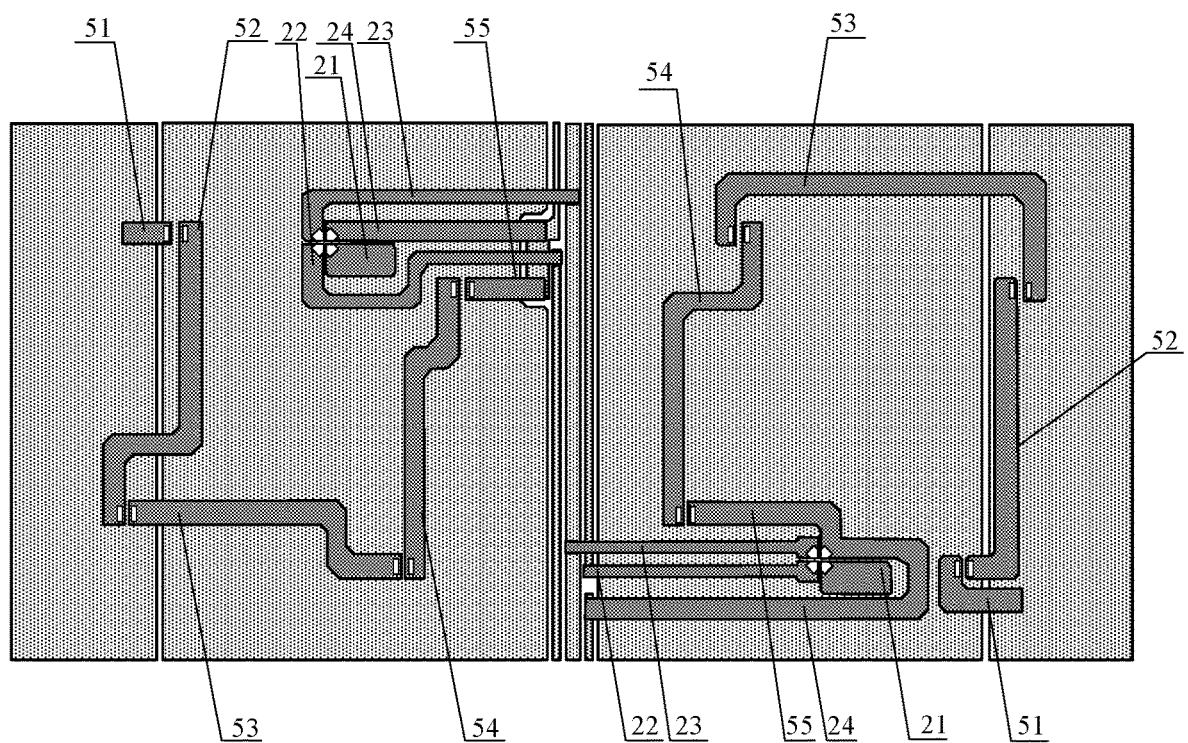
FIG. 13 is a first schematic diagram after a second conductive layer is formed.
Figure 14:
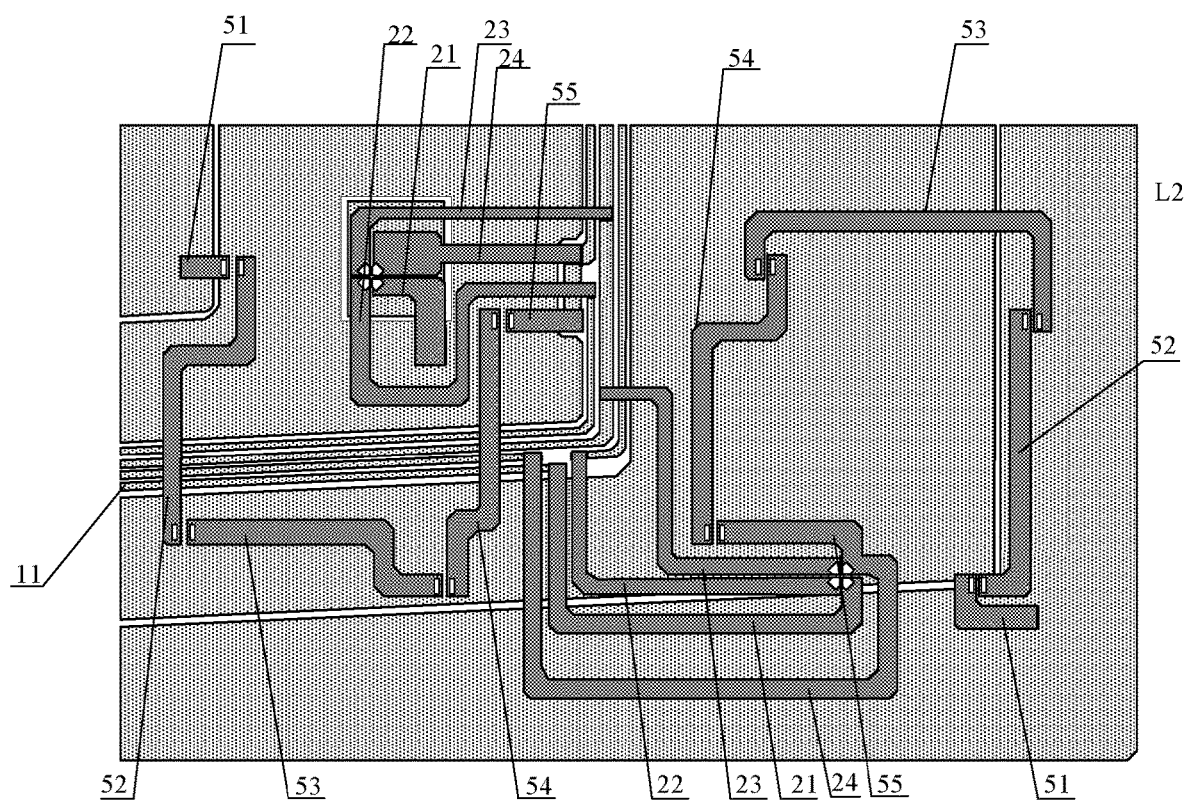
FIG. 14 is a second schematic diagram after a second conductive layer is formed.

(3) A pattern of a second conductive layer is formed. In an exemplary embodiment, forming the pattern of the second conductive layer may include: on the substrate on which the aforementioned patterns are formed, a second metal thin film is deposited, the second metal thin film is patterned through a patterning process, the pattern of the second conductive layer is formed on the second insulation layer, the pattern of the second conductive layer at least includes the first connection line 51, the second connection line 52, the third connection line 53, the fourth connection line 54, the fifth connection line 55, the first pad connection line 21, the second pad connection line 22, the third pad connection line 23, and the fourth pad connection line 24 as shown in FIGS. 13 and 14. FIG. 13 is a first schematic diagram after the second conductive layer is formed, and FIG. 14 is a second schematic diagram after the second conductive layer is formed. FIG. 13 is illustrated by taking a case that two light emitting units are not connected with a signal detection line as an example, and FIG. 14 is illustrated by taking a case that one light emitting unit is not connected with a signal detection line and the other light emitting unit is connected with the signal detection line as an example.

In an exemplary embodiment, for one of columns of light emitting units, a first connection line in a light emitting unit is electrically connected with a second signal line in the light emitting unit through a third via, a first pad connection line in the light emitting unit is electrically connected with a first signal line in the light emitting unit through a second via, a second pad connection line in the light emitting unit is electrically connected with a fourth signal line in the light emitting unit through a fourth via, a third pad connection line in the light emitting unit is electrically connected with a fifth signal line in the light emitting unit through a fifth via, a fourth pad connection line in the light emitting unit is electrically connected with a third signal line in the light emitting unit through a sixth via, and a fifth connection line in the light emitting unit is electrically connected with the third signal line in the light emitting unit through the sixth via.

In an exemplary embodiment, a first connection line in another column of light emitting units is electrically connected with a second signal line in a light emitting unit through a third via, a first pad connection line in the light emitting unit is electrically connected with a first signal line in the light emitting unit through a second via, a second pad connection line in the light emitting unit is connected with a fourth signal line in the light emitting unit through a fourth via, a third pad connection line in the light emitting unit is electrically connected with a fifth signal line in the light emitting unit through a fifth via, a fourth pad connection line in the light emitting unit is electrically connected with a third signal line in the light emitting unit through a sixth via, and a first pad connection line with which a signal detection line is connected is electrically connected with the signal detection line through a first via.

(4) A pattern of a third insulation layer is formed. Forming the pattern of the third insulation layer may include: a third insulation thin film is deposited on the substrate on which the aforementioned patterns are formed, and the third insulation thin film is patterned through a patterning process to form the pattern of the third insulation layer on the second conductive layer.

So far, preparation of the drive backplane according to the exemplary embodiment of the present disclosure is completed, and the drive backplane includes the first insulation layer, the first conductive layer, the second insulation layer, the second conductive layer, and the third insulation layer stacked on the substrate. Herein, The first conductive layer includes a signal detection line, a first signal line, a second signal line, a third signal line, a fourth signal line, and a fifth signal line; the second conductive layer includes a first connection line, a second connection line, a third connection line, a fourth connection line, a fifth connection line, a first pad connection line, a second pad connection line, a third pad connection line, and a fourth pad connection line.

An embodiment of the present disclosure also provides a display apparatus, which includes the display substrate provided in any one of the aforementioned embodiments.

In an exemplary embodiment, the display apparatus may be a display, a television, a mobile phone, a tablet computer, a navigator, a digital photo frame, a wearable display product, or a product or component with any display function.

An embodiment of the present disclosure also provides a preparation method of a drive backplane, which is used for preparing the drive backplane according to the aforementioned exemplary embodiments. The preparation method of the drive backplane according to the embodiment of the present disclosure may include following acts.

In act S1, a substrate is provided.

In an exemplary embodiment, the substrate includes a light emitting region and a bonding region, the light emitting region includes light emitting units arranged in an array, and each light emitting unit includes a first signal line and a pad electrically connected with the first signal line.

In an exemplary embodiment, the substrate may be a rigid substrate or a flexible substrate, wherein the rigid substrate may be, but is not limited to, one or more of glass, metal foils, and polychorinated biphenyls; and the flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In act S2, a first conductive layer is formed on the substrate.

In an exemplary embodiment, the first conductive layer includes a first signal line and at least one signal detection line.

In act S3, a second conductive layer is formed on a side of the first conductive layer away from the substrate.

In an exemplary embodiment, the second conductive layer includes a first pad connection line; the signal detection line is electrically connected with a pad of a light emitting unit.

In an exemplary embodiment, the act S2 may include: forming a first insulation layer on the substrate; and forming a first conductive layer on the first insulation layer.

In an exemplary embodiment, the first conductive layer may further include a second signal line, a third signal line, a fourth signal line, and a fifth signal line.

In an exemplary embodiment, the act S3 may include: forming a second insulation layer on the first conductive layer; and forming a second conductive layer on the second insulation layer.

In an exemplary embodiment, the second conductive layer may further include a first connection line, a second connection line, a third connection line, a fourth connection line, and a fifth connection line.

In an exemplary embodiment, after the act S3, the preparation method of the drive backplane may include: forming a third insulation layer on the second conductive layer.

Specific contents of the preparation method of the drive backplane in the present disclosure has been described in detail in the aforementioned preparation process of the drive backplane and will not be repeated here.

Although the implementations disclosed in the present disclosure are described as above, the described contents are only implementations which are used in order to facilitate understanding of the present disclosure, and are not intended to limit the present disclosure. Any skilled person in the art to which the present disclosure pertains may make any modifications and variations in forms and details of implementation without departing from the spirit and scope of the present disclosure. However, the patent protection scope of the present disclosure should be subject to the scope defined by the appended claims.

The invention claimed is:
1. A drive backplane, comprising:
a substrate; wherein the substrate comprises a light emitting region and a bonding region, the light emitting region comprises light emitting units arranged in an array, and each light emitting unit comprises a first signal line and a pad electrically connected with the first signal line;
a first conductive layer, which is disposed on one side of the substrate and comprises the first signal line and at least one signal detection line; and
a second conductive layer, which is disposed on one side of the first conductive layer away from the substrate and comprises the pad; wherein the signal detection line is electrically connected with the pad of the light emitting unit;
wherein the drive backplane further comprises: a bonding terminal which is disposed on the substrate and located in the bonding region, and a flexible circuit board electrically connected with the bonding terminal; the pad of the light emitting unit is electrically connected with the bonding terminal through the signal detection line;
the light emitting region is divided into at least one light emitting sub-region; and at least one signal detection line is electrically connected with a pad of at least one light emitting unit in each light emitting sub-region;
one of the at least one signal detection line is electrically connected with a pad of one light emitting unit in each light emitting sub-region; and
the drive backplane further comprises: a first insulation layer disposed between the substrate and the first conductive layer, a second insulation layer disposed between the first conductive layer and the second conductive layer, and a third insulation layer disposed on one side of the second conductive layer away from the substrate;
the second insulation layer is provided with a first via and a second via;
the first via exposes the first signal line, and the second via exposes the signal detection line; and
the pad of the light emitting unit is electrically connected with the first signal line through the first via and is electrically connected with the signal detection line through the second via.

2. The drive backplane according to claim 1, wherein one of the at least one signal detection line is electrically connected with a pad of a light emitting unit located in a last row and a k-th column in each light emitting sub-region; 1≤k≤m, wherein m is a total number of columns of light emitting units in the light emitting sub-region.

3. The drive backplane according to claim 1, wherein the drive backplane comprises at least two drive sub-backplanes; and
each drive backplane comprises at least one light emitting sub-region.

4. The drive backplane according to claim 3, wherein the first signal line extends along a first direction, and the light emitting unit further comprises a second signal line, a third signal line, a fourth signal line, and a fifth signal line extending along the first direction; the first signal line and the second signal line are arranged along a second direction, the third signal line and the fourth signal line are arranged along the first direction, the first direction and the second direction intersect; the first conductive layer further comprises the second signal line, the third signal line, the fourth signal line, and the fifth signal line;
the second signal line is located on one side of the first signal line, the third signal line and the fourth signal line are located on one side of the first signal line away from the second signal line, and the fifth signal line is located on one side of the third signal line away from the first signal line; and
the signal detection line is disposed between the third signal line and the first signal line in a light emitting unit where a pad with which the signal detection line is connected is located.

5. The drive backplane according to claim 4, wherein first signal lines of light emitting units located in a same column are a same signal line.

6. The drive backplane according to claim 4, wherein a width of the first signal line is greater than a width of the second signal line;
the width of the second signal line is greater than a width of the fifth signal line;
the width of the fifth signal line is greater than a width of the third signal line;
the width of the fifth signal line is greater than a width of the fourth signal line;
a width of the signal detection line is less than the width of the fifth signal line; and
the width of the signal detection line is about 0.5 mm to 1.5 mm.

7. The drive backplane according to claim 1, wherein, for each light emitting unit, an orthographic projection of the pad on the substrate is partially overlapped with an orthographic projection of the first signal line on the substrate; and
an orthographic projection of the signal detection line on the substrate is partially overlapped with the orthographic projection of the pad on the substrate.

8. The drive backplane according to claim 1, wherein the light emitting unit further comprises a first die-bonding region, a second die-bonding region, a third die-bonding region, a fourth die-bonding region, a first connection line, a second connection line, a third connection line, a fourth connection line, and a fifth connection line, the pad comprises a first pad connection line, a second pad connection line, a third pad connection line, a fourth pad connection line, a first input terminal, a second input terminal, an output terminal, and a common voltage terminal; each die-bonding region comprises a first terminal and a second terminal oppositely disposed at intervals, and the first terminal and the second terminal are configured to connect two electrodes of a same light emitting element;
the second conductive layer further comprises the first connection line, the second connection line, the third connection line, the fourth connection line, and the fifth connection line;
a first end of the first connection line is electrically connected with a second signal line, a second end of the first connection line extends to the first die-bonding region and forms a first terminal in the first die-bonding region; a first end of the second connection line extends to the first die-bonding region and forms a second terminal in the first die-bonding region, a second end of the second connection line extends to the second die-bonding region and forms a first terminal in the second die-bonding region; a first end of the third connection line extends to the second die-bonding region and forms a second terminal in the second die-bonding region, a second end of the third connection line extends to the third die-bonding region and forms a first terminal in the third die-bonding region; a first end of the fourth connection line extends to the third die-bonding region, and forms a second terminal in the third die-bonding region, a second end of the fourth connection line extends to the fourth die-bonding region and forms a first terminal in the fourth die-bonding region, a first end of the fifth connection line extends to the fourth die-bonding region and forms a first terminal in the fourth die-bonding region, a second end of the fifth connection line is electrically connected with a third signal line;

the first pad connection line and the second pad connection line are arranged along a second direction, the second pad connection line and the third pad connection line are arranged along a first direction, the third pad connection line and the fourth pad connection line are arranged along the second direction, and the fourth pad connection line and the first pad connection line are arranged along the first direction; the first pad connection line is located on a side of the second pad connection line close to a fifth signal line;

the first pad connection line is electrically connected with the common voltage terminal and the first signal line, the second pad connection line is electrically connected with the first input terminal and a fourth signal line, the third pad connection line is electrically connected with the second input terminal and the fifth signal line, and the fourth pad connection line is electrically connected with the output terminal and the third signal line;

the fifth connection line and the fourth pad connection line are disposed separately, or the fifth connection line and the fourth pad connection line are a same signal line.

9. The drive backplane according to claim 8, wherein the second insulation layer is further provided with a third via to a sixth via;

the third via exposes the second signal line, a fourth via exposes the fourth signal line, a fifth via exposes the fifth signal line, and the sixth via exposes the third signal line;

for each light emitting unit, a first connection line is electrically connected with a second signal line through the third via, a first pad connection line is electrically connected with a first signal line through the first via and is electrically connected with a signal detection line through the second via, a second pad connection line is electrically connected with a fourth signal line through the fourth via, a third pad connection line is electrically connected with a fifth signal line through the fifth via, and a fourth pad connection line and a fifth connection line are electrically connected with a third signal line through the sixth via.

10. A display apparatus, comprising the drive backplane according to claim 1.

11. A preparation method of the drive backplane according to claim 1, wherein the method comprises:
providing the substrate;
forming the first conductive layer on the substrate; and
forming the second conductive layer on the side of the first conductive layer away from the substrate.

12. The method according to claim 11, wherein the forming the first conductive layer on the substrate comprises:
forming the first insulation layer on the substrate;
forming the first conductive layer on the first insulation layer, wherein the first conductive layer further comprises a second signal line, a third signal line, a fourth signal line, and a fifth signal line;
the forming the second conductive layer on the side of the first conductive layer away from the substrate comprises:
forming the second insulation layer on the first conductive layer; and
forming the second conductive layer on the second insulation layer, wherein the second conductive layer further comprises a first connection line, a second connection line, a third connection line, a fourth connection line, and a fifth connection line;
after forming the second conductive layer on the side of the first conductive layer away from the substrate, the method further comprises:
forming the third insulation layer on the second conductive layer.

* * * * *